United States Patent
Schilling

(10) Patent No.: US 7,399,708 B2
(45) Date of Patent: Jul. 15, 2008

(54) METHOD OF TREATING A COMPOSITE SPIN-ON GLASS/ANTI-REFLECTIVE MATERIAL PRIOR TO CLEANING

(75) Inventor: Paul Schilling, Sammamish, WA (US)

(73) Assignee: Tokyo Electron Limited, Tokyo (JP)

( * ) Notice: Subject to any disclaimer, the term of this patent is extended or adjusted under 35 U.S.C. 154(b) by 292 days.

(21) Appl. No.: 11/094,939

(22) Filed: Mar. 30, 2005

(65) Prior Publication Data

US 2006/0223314 A1    Oct. 5, 2006

(51) Int. Cl.
*H01L 21/307* (2006.01)
*H01L 21/461* (2006.01)
(52) U.S. Cl. ............... 438/706; 257/E21.222; 257/E21.224; 438/909; 118/50
(58) Field of Classification Search ............ 438/706, 438/909; 427/255.25; 257/E21.222, E21.224; 118/50, 723 VE
See application file for complete search history.

(56) References Cited

U.S. PATENT DOCUMENTS

| | | | |
|---|---|---|---|
| 2,439,689 A | 4/1948 | Hyde et al. | |
| 2,617,719 A | 11/1952 | Stewart | |
| 2,993,449 A | 7/1961 | Harland | 103/87 |
| 3,135,211 A | 6/1964 | Pezzillo | 103/87 |
| 3,642,020 A | 2/1972 | Payne | 137/112 |
| 3,646,948 A | 3/1972 | Athey | 134/57 D |
| 3,890,176 A | 6/1975 | Bolon | 156/2 |
| 3,900,551 A | 8/1975 | Bardoncelli et al. | 423/9 |
| 4,219,333 A | 8/1980 | Harris | 8/137 |
| 4,341,592 A | 7/1982 | Shortes et al. | 156/643 |
| 4,349,415 A | 9/1982 | DeFilippi et al. | 203/14 |
| 4,475,993 A | 10/1984 | Blander et al. | 204/64 |
| 4,618,769 A | 10/1986 | Johnson et al. | 250/338 |
| 4,730,630 A | 3/1988 | Ranft | 134/111 |
| 4,749,440 A | 6/1988 | Blackwood et al. | 156/646 |
| 4,838,476 A | 6/1989 | Rahn | 228/180.1 |
| 4,877,530 A | 10/1989 | Moses | 210/511 |
| 4,879,004 A | 11/1989 | Oesch et al. | 203/89 |

(Continued)

FOREIGN PATENT DOCUMENTS

DE    39 04 514 C2    8/1990

(Continued)

OTHER PUBLICATIONS

J.B. Rubin et al. "A Comparison of Chilled DI Water/Ozone and Co2-Based Supercritical Fluids as Replacements for Photoresist-Stripping Solvents", IEEE/CPMT Int'l Electronics Manufacturing Technology Symposium, 1998, pp. 308-314.

(Continued)

*Primary Examiner*—Caridad Everhart
(74) *Attorney, Agent, or Firm*—Haverstock & Owens LLP

(57) ABSTRACT

Methods are provided for cleaning a microelectronic device, and one method includes providing a substrate having a patterned SOG/anti-reflective material; performing a process to cure the patterned SOG/anti-reflective material; and performing a cleaning process to remove the cured SOG/anti-reflective material. An apparatus for cleaning a microelectronic device is provided that includes a processing chamber; means for performing a SOG/anti-reflective material curing process within the processing chamber, means for performing a cleaning process within the processing chamber and means for venting the processing chamber.

21 Claims, 8 Drawing Sheets

U.S. PATENT DOCUMENTS

| | | | |
|---|---|---|---|
| 4,923,828 A | 5/1990 | Gluck et al. | 156/643 |
| 4,925,790 A | 5/1990 | Blanch et al. | 435/52 |
| 4,933,404 A | 6/1990 | Beckman et al. | 526/207 |
| 4,944,837 A | 7/1990 | Nishikawa et al. | 156/646 |
| 5,011,542 A | 4/1991 | Weil | 134/38 |
| 5,013,366 A | 5/1991 | Jackson et al. | 134/1 |
| 5,068,040 A | 11/1991 | Jackson | 210/748 |
| 5,071,485 A | 12/1991 | Matthews et al. | 134/2 |
| 5,091,207 A | 2/1992 | Tanaka | 427/8 |
| 5,105,556 A | 4/1992 | Kurokawa et al. | 34/12 |
| 5,158,704 A | 10/1992 | Fulton et al. | 252/309 |
| 5,174,917 A | 12/1992 | Monzyk | 252/60 |
| 5,185,058 A | 2/1993 | Cathey, Jr. | 156/656 |
| 5,185,296 A | 2/1993 | Morita et al. | 403/310 |
| 5,196,134 A | 3/1993 | Jackson | 252/103 |
| 5,197,800 A | 3/1993 | Saidman et al. | 366/136 |
| 5,201,960 A | 4/1993 | Starov | 134/11 |
| 5,213,619 A | 5/1993 | Jackson et al. | 134/1 |
| 5,215,592 A | 6/1993 | Jackson | 134/1 |
| 5,225,173 A | 7/1993 | Wai | 423/2 |
| 5,236,602 A | 8/1993 | Jackson | 210/748 |
| 5,237,824 A | 8/1993 | Pawliszyn | 65/51.1 |
| 5,238,671 A | 8/1993 | Matson et al. | 423/397 |
| 5,250,078 A | 10/1993 | Saus et al. | 8/475 |
| 5,261,965 A | 11/1993 | Moslehi | 134/1 |
| 5,266,205 A | 11/1993 | Fulton et al. | 210/639 |
| 5,269,815 A | 12/1993 | Schlenker et al. | 8/475 |
| 5,269,850 A | 12/1993 | Jackson | 134/2 |
| 5,274,129 A | 12/1993 | Natale et al. | 549/349 |
| 5,285,352 A | 2/1994 | Pastore et al. | 361/747 |
| 5,288,333 A | 2/1994 | Tanaka et al. | 134/31 |
| 5,290,361 A | 3/1994 | Hayashida et al. | 134/2 |
| 5,294,261 A | 3/1994 | McDermott et al. | 134/7 |
| 5,298,032 A | 3/1994 | Schlenker et al. | 4/475 |
| 5,304,515 A | 4/1994 | Morita et al. | 438/725 |
| 5,306,350 A | 4/1994 | Hoy et al. | 134/22.14 |
| 5,312,882 A | 5/1994 | DeSimone et al. | 526/201 |
| 5,314,574 A | 5/1994 | Takahashi | 156/646 |
| 5,316,591 A | 5/1994 | Chao et al. | 134/34 |
| 5,320,742 A | 6/1994 | Fletcher et al. | 208/89 |
| 5,328,722 A | 7/1994 | Ghanayem et al. | 427/250 |
| 5,334,332 A | 8/1994 | Lee | 252/548 |
| 5,334,493 A | 8/1994 | Fujita et al. | 430/463 |
| 5,339,539 A | 8/1994 | Shiraishi et al. | 34/58 |
| 5,352,327 A | 10/1994 | Witowski | 156/646 |
| 5,356,538 A | 10/1994 | Wai et al. | 210/634 |
| 5,364,497 A | 11/1994 | Chau et al. | 156/645 |
| 5,370,740 A | 12/1994 | Chao et al. | 134/1 |
| 5,370,741 A | 12/1994 | Bergman | 134/3 |
| 5,370,742 A | 12/1994 | Mitchell et al. | 134/10 |
| 5,378,311 A * | 1/1995 | Nagayama et al. | 438/16 |
| 5,397,220 A | 3/1995 | Akihisa et al. | 417/369 |
| 5,401,322 A | 3/1995 | Marshall | 134/13 |
| 5,403,621 A | 4/1995 | Jackson et al. | 427/255.1 |
| 5,403,665 A | 4/1995 | Alley et al. | 428/447 |
| 5,417,768 A | 5/1995 | Smith, Jr. et al. | 134/10 |
| 5,456,759 A | 10/1995 | Stanford, Jr. et al. | 134/1 |
| 5,470,393 A | 11/1995 | Fukazawa | 134/3 |
| 5,474,812 A | 12/1995 | Truckenmuller et al. | 427/430.1 |
| 5,482,564 A | 1/1996 | Douglas et al. | 134/18 |
| 5,486,212 A | 1/1996 | Mitchell et al. | 8/142 |
| 5,494,526 A | 2/1996 | Paranjpe | 134/1 |
| 5,500,081 A | 3/1996 | Bergman | 156/646.1 |
| 5,501,761 A | 3/1996 | Evans et al. | 156/344 |
| 5,514,220 A | 5/1996 | Wetmore et al. | 134/22.18 |
| 5,522,938 A | 6/1996 | O'Brien | 134/1 |
| 5,547,774 A | 8/1996 | Gimzewski et al. | 428/694 |
| 5,550,211 A | 8/1996 | DeCrosta et al. | 528/480 |
| 5,580,846 A | 12/1996 | Hayashida et al. | 510/175 |
| 5,589,082 A | 12/1996 | Lin et al. | 216/2 |
| 5,589,105 A | 12/1996 | DeSimone et al. | 252/351 |
| 5,629,918 A | 5/1997 | Ho et al. | 369/112 |
| 5,632,847 A | 5/1997 | Ohno et al. | 156/344 |
| 5,635,463 A | 6/1997 | Muraoka | 510/175 |
| 5,637,151 A | 6/1997 | Schulz | 134/2 |
| 5,641,887 A | 6/1997 | Beckman et al. | 546/26.2 |
| 5,656,097 A | 8/1997 | Olesen et al. | 134/1 |
| 5,665,527 A | 9/1997 | Allen et al. | 430/325 |
| 5,676,705 A | 10/1997 | Jureller et al. | 8/142 |
| 5,679,169 A | 10/1997 | Gonzales et al. | 134/1.3 |
| 5,679,171 A | 10/1997 | Saga et al. | 134/3 |
| 5,683,473 A | 11/1997 | Jureller et al. | 8/142 |
| 5,683,977 A | 11/1997 | Jureller et al. | 510/286 |
| 5,688,617 A * | 11/1997 | Mikami et al. | 430/5 |
| 5,688,879 A | 11/1997 | DeSimone | 526/89 |
| 5,700,379 A | 12/1997 | Biebl | 216/2 |
| 5,714,299 A | 2/1998 | Combes et al. | 430/137 |
| 5,725,987 A | 3/1998 | Combes et al. | 430/137 |
| 5,726,211 A | 3/1998 | Hedrick et al. | 521/61 |
| 5,730,874 A | 3/1998 | Wai et al. | 210/638 |
| 5,736,425 A | 4/1998 | Smith et al. | 438/778 |
| 5,739,223 A | 4/1998 | DeSimone | 526/89 |
| 5,766,367 A | 6/1998 | Smith et al. | 134/2 |
| 5,783,082 A | 7/1998 | DeSimone et al. | 210/634 |
| 5,797,719 A | 8/1998 | James et al. | 417/46 |
| 5,798,438 A | 8/1998 | Sawan et al. | 428/483 |
| 5,804,607 A | 9/1998 | Hedrick et al. | 521/64 |
| 5,807,607 A | 9/1998 | Smith et al. | 427/96 |
| 5,847,443 A | 12/1998 | Cho et al. | 257/632 |
| 5,866,005 A | 2/1999 | DeSimone et al. | 210/634 |
| 5,868,856 A | 2/1999 | Douglas et al. | 134/2 |
| 5,868,862 A | 2/1999 | Douglas et al. | 134/26 |
| 5,872,061 A | 2/1999 | Lee et al. | 438/705 |
| 5,872,257 A | 2/1999 | Beckman et al. | 546/336 |
| 5,873,948 A | 2/1999 | Kim | 134/19 |
| 5,881,577 A | 3/1999 | Sauer et al. | 68/5 |
| 5,888,050 A | 3/1999 | Fitzgerald et al. | 417/46 |
| 5,890,501 A | 4/1999 | Kaneko et al. | 134/1.3 |
| 5,893,756 A | 4/1999 | Berman et al. | 438/692 |
| 5,896,870 A | 4/1999 | Huynh et al. | 134/1.3 |
| 5,900,354 A | 5/1999 | Batchelder | 430/395 |
| 5,904,737 A | 5/1999 | Preston et al. | 8/158 |
| 5,908,510 A | 6/1999 | McCullough et al. | 134/2 |
| 5,928,389 A | 7/1999 | Jevtic | 29/25.01 |
| 5,932,100 A | 8/1999 | Yager et al. | 210/634 |
| 5,944,996 A | 8/1999 | DeSimone et al. | 210/634 |
| 5,954,101 A | 9/1999 | Drube et al. | 141/82 |
| 5,955,140 A | 9/1999 | Smith et al. | 427/96 |
| 5,965,025 A | 10/1999 | Wai et al. | 210/634 |
| 5,976,264 A | 11/1999 | McCullough et al. | 134/2 |
| 5,980,648 A | 11/1999 | Adler | 134/34 |
| 5,992,680 A | 11/1999 | Smith | 220/812 |
| 5,994,696 A | 11/1999 | Tai et al. | 250/288 |
| 6,005,226 A | 12/1999 | Aschner et al. | 219/390 |
| 6,017,820 A | 1/2000 | Ting et al. | 438/689 |
| 6,021,791 A | 2/2000 | Dryer et al. | 134/100.1 |
| 6,024,801 A | 2/2000 | Wallace et al. | 134/1 |
| 6,037,277 A | 3/2000 | Masakara et al. | 438/787 |
| 6,063,714 A | 5/2000 | Smith et al. | 438/778 |
| 6,067,728 A | 5/2000 | Farmer et al. | 34/470 |
| 6,099,619 A | 8/2000 | Lansbarkis et al. | 95/118 |
| 6,100,198 A | 8/2000 | Grieger et al. | 438/692 |
| 6,110,232 A | 8/2000 | Chen et al. | 29/25.01 |
| 6,114,044 A | 9/2000 | Houston et al. | 428/447 |
| 6,128,830 A | 10/2000 | Bettcher et al. | 34/404 |
| 6,140,252 A | 10/2000 | Cho et al. | 438/781 |
| 6,149,828 A | 11/2000 | Vaartstra | 156/646 |
| 6,171,645 B1 | 1/2001 | Smith et al. | 427/96 |
| 6,200,943 B1 | 3/2001 | Romack et al. | 510/285 |
| 6,216,364 B1 | 4/2001 | Tanaka et al. | 34/448 |
| 6,224,774 B1 | 5/2001 | DeSimone et al. | 210/634 |
| 6,228,563 B1 | 5/2001 | Starov et al. | 430/327 |
| 6,228,826 B1 | 5/2001 | DeYoung et al. | 510/291 |
| 6,232,238 B1 | 5/2001 | Chang et al. | 438/725 |

| | | | |
|---|---|---|---|
| 6,232,417 B1 | 5/2001 | Rhodes et al. .............. 526/171 |
| 6,235,145 B1 | 5/2001 | Li et al. ..................... 156/345 |
| 6,239,038 B1 | 5/2001 | Wen .......................... 438/745 |
| 6,242,165 B1 | 6/2001 | Vaartstra ................... 430/329 |
| 6,251,250 B1 | 6/2001 | Keigler ....................... 205/89 |
| 6,255,732 B1 | 7/2001 | Yokoyama et al. ......... 257/760 |
| 6,262,510 B1 | 7/2001 | Lungu ........................ 310/254 |
| 6,270,531 B1 | 8/2001 | DeYoung et al. ............... 8/142 |
| 6,270,948 B1 | 8/2001 | Sato et al. .................. 430/314 |
| 6,277,753 B1 | 8/2001 | Mullee et al. ............... 438/692 |
| 6,284,558 B1 | 9/2001 | Sakamoto .................... 430/30 |
| 6,286,231 B1 | 9/2001 | Bergman et al. ............. 34/410 |
| 6,306,564 B1 | 10/2001 | Mullee ....................... 430/329 |
| 6,319,858 B1 | 11/2001 | Lee et al. .................... 438/787 |
| 6,331,487 B2 | 12/2001 | Koch .......................... 438/692 |
| 6,333,268 B1 | 12/2001 | Starov et al. ................ 438/687 |
| 6,344,243 B1 | 2/2002 | McClain et al. .......... 427/388.1 |
| 6,358,673 B1 | 3/2002 | Namatsu .................... 430/311 |
| 6,361,696 B1 | 3/2002 | Spiegelman et al. ........ 210/662 |
| 6,367,491 B1 | 4/2002 | Marshall et al. .......... 134/104.4 |
| 6,380,105 B1 | 4/2002 | Smith et al. ................. 438/778 |
| 6,425,956 B1 | 7/2002 | Cotte et al. .................... 134/3 |
| 6,436,824 B1 | 8/2002 | Chooi et al. ................ 438/687 |
| 6,454,945 B1 | 9/2002 | Weigl et al. ................ 210/634 |
| 6,458,494 B2 | 10/2002 | Song et al. .................... 430/5 |
| 6,461,967 B2 | 10/2002 | Wu et al. .................... 438/705 |
| 6,465,403 B1 | 10/2002 | Skee ........................... 510/175 |
| 6,485,895 B1 | 11/2002 | Choi et al. .................. 430/330 |
| 6,486,078 B1 | 11/2002 | Rangarajan et al. ......... 438/778 |
| 6,492,090 B1 | 12/2002 | Nishi et al. ............... 430/270.1 |
| 6,500,605 B1 | 12/2002 | Mullee et al. .............. 430/329 |
| 6,509,141 B2 | 1/2003 | Mullee ....................... 430/329 |
| 6,537,916 B2 | 3/2003 | Mullee et al. .............. 438/692 |
| 6,558,475 B1 | 5/2003 | Jur et al. ...................... 134/21 |
| 6,562,146 B1 | 5/2003 | DeYoung et al. ............. 134/30 |
| 6,596,093 B2 | 7/2003 | DeYoung et al. ............. 134/36 |
| 6,635,565 B2 | 10/2003 | Wu et al. .................... 438/687 |
| 6,641,678 B2 | 11/2003 | DeYoung et al. ............. 134/36 |
| 6,669,785 B2 | 12/2003 | DeYoung et al. ............... 134/3 |
| 6,712,081 B1 | 3/2004 | Uehara et al. ............... 134/105 |
| 6,764,552 B1 | 7/2004 | Joyce et al. ..................... 134/3 |
| 6,848,458 B1 | 2/2005 | Shrinivasan et al. ........ 134/108 |
| 6,890,853 B2 | 5/2005 | Biberger et al. ............. 438/670 |
| 7,044,143 B2 | 5/2006 | DeYoung et al. ........... 134/105 |
| 2001/0019857 A1 | 9/2001 | Yokoyama et al. ......... 438/142 |
| 2001/0024247 A1 | 9/2001 | Nakata ......................... 349/43 |
| 2001/0041455 A1 | 11/2001 | Yun et al. .................... 438/745 |
| 2001/0041458 A1 | 11/2001 | Ikakura et al. .............. 438/778 |
| 2002/0001929 A1 | 1/2002 | Biberger et al. ............. 438/584 |
| 2002/0014257 A1 | 2/2002 | Chandra et al. ............... 134/19 |
| 2002/0055323 A1 | 5/2002 | McClain et al. ............... 451/41 |
| 2002/0074289 A1 | 6/2002 | Sateria et al. ................ 210/664 |
| 2002/0081533 A1 | 6/2002 | Simons et al. ............... 430/325 |
| 2002/0088477 A1 | 7/2002 | Cotte et al. .................... 134/2 |
| 2002/0098680 A1 | 7/2002 | Goldstein et al. ........... 438/625 |
| 2002/0106867 A1 | 8/2002 | Yang et al. .................. 438/458 |
| 2002/0112740 A1 | 8/2002 | DeYoung et al. ............... 134/3 |
| 2002/0112746 A1 | 8/2002 | DeYoung et al. ............ 134/36 |
| 2002/0115022 A1 | 8/2002 | Messick et al. ............. 430/311 |
| 2002/0117391 A1 | 8/2002 | Beam .......................... 203/81 |
| 2002/0123229 A1 | 9/2002 | Ono et al. .................... 438/706 |
| 2002/0127844 A1 | 9/2002 | Grill et al. ................... 438/622 |
| 2002/0132192 A1 | 9/2002 | Namatsu ..................... 430/322 |
| 2002/0141925 A1 | 10/2002 | Wong et al. ................. 423/262 |
| 2002/0142595 A1 | 10/2002 | Chiou ......................... 438/694 |
| 2002/0150522 A1 | 10/2002 | Heim et al. .................. 422/190 |
| 2002/0164873 A1 | 11/2002 | Masuda et al. .............. 438/689 |
| 2003/0003762 A1 | 1/2003 | Cotte et al. .................. 438/745 |
| 2003/0008155 A1 | 1/2003 | Hayashi et al. ............. 428/447 |
| 2003/0008238 A1 | 1/2003 | Goldfarb et al. ......... 430/272.1 |
| 2003/0008518 A1 | 1/2003 | Chang et al. ................ 438/745 |
| 2003/0013311 A1 | 1/2003 | Chang et al. ................ 438/704 |
| 2003/0036023 A1 | 2/2003 | Moreau et al. .............. 430/324 |
| 2003/0047533 A1 | 3/2003 | Reid et al. ..................... 216/24 |
| 2003/0051741 A1 | 3/2003 | DeSimone et al. ............. 134/21 |
| 2000/0081206 | 5/2003 | Doyle ........................ 356/301 |
| 2003/0106573 A1 | 6/2003 | Masuda et al. ................ 134/26 |
| 2003/0125225 A1 | 7/2003 | Xu et al. ..................... 510/175 |
| 2003/0198895 A1 | 10/2003 | Toma et al. ................. 430/314 |
| 2003/0205510 A1 | 11/2003 | Jackson ........................ 210/86 |
| 2003/0217764 A1 | 11/2003 | Masuda et al. ................ 134/26 |
| 2004/0011386 A1 | 1/2004 | Seghal ......................... 134/26 |
| 2004/0018452 A1 | 1/2004 | Schilling .................... 430/314 |
| 2004/0018518 A1 | 2/2004 | DeYoung et al. ............. 134/30 |
| 2004/0045588 A1 | 3/2004 | DeYoung et al. ............. 134/26 |
| 2004/0048194 A1* | 3/2004 | Breyta et al. ............. 430/271.1 |
| 2004/0050406 A1 | 3/2004 | Sehgal ......................... 134/26 |
| 2004/0087457 A1 | 5/2004 | Korzenski et al. ........... 510/177 |
| 2004/0103922 A1 | 6/2004 | Inoue et al. ................... 134/26 |
| 2004/0112409 A1 | 6/2004 | Schilling ..................... 134/26 |
| 2004/0118812 A1 | 6/2004 | Watkins et al. ................ 216/83 |
| 2004/0121269 A1 | 6/2004 | Liu et al. ..................... 430/329 |
| 2004/0134515 A1 | 7/2004 | Castrucci ........................ 134/2 |
| 2004/0168709 A1 | 9/2004 | Drumm et al. ................ 134/18 |
| 2004/0175958 A1 | 9/2004 | Lin et al. ..................... 438/778 |
| 2004/0177867 A1 | 9/2004 | Schilling ..................... 134/26 |
| 2004/0211440 A1 | 10/2004 | Wang et al. ..................... 134/2 |
| 2004/0255978 A1* | 12/2004 | Fury et al. .................... 134/18 |
| 2004/0259357 A1 | 12/2004 | Saga ........................... 438/689 |
| 2006/0003592 A1 | 1/2006 | Gale et al. ................... 438/745 |
| 2006/0102204 A1 | 5/2006 | Jacobson et al. ............. 134/26 |
| 2006/0102208 A1 | 5/2006 | Jacobson et al. ............. 134/56 |
| 2006/0180175 A1* | 8/2006 | Parent ........................ 134/1.3 |

FOREIGN PATENT DOCUMENTS

| | | |
|---|---|---|
| DE | 40 04 111 C2 | 8/1990 |
| DE | 39 06 724 C2 | 9/1990 |
| DE | 39 06 735 C2 | 9/1990 |
| DE | 39 06 737 A1 | 9/1990 |
| DE | 44 29 470 A1 | 3/1995 |
| DE | 43 44 021 A1 | 6/1995 |
| EP | 0 283 740 A2 | 9/1988 |
| EP | 0 302 345 A2 | 2/1989 |
| EP | 0 370 233 A1 | 5/1990 |
| EP | 0 391 035 A2 | 10/1990 |
| EP | 0 518 653 B1 | 12/1992 |
| EP | 0 536 752 A2 | 4/1993 |
| EP | 0 572 913 A1 | 12/1993 |
| EP | 0 620 270 A3 | 10/1994 |
| EP | 0 641 611 A1 | 8/1995 |
| EP | 0 679 753 B1 | 11/1995 |
| EP | 0 711 864 B1 | 5/1996 |
| EP | 0 726 099 A2 | 8/1996 |
| EP | 0 727 711 A2 | 8/1996 |
| EP | 0 822 583 A2 | 2/1998 |
| EP | 0 829 312 A2 | 3/1998 |
| EP | 0 836 895 A2 | 4/1998 |
| JP | 60-192333 | 9/1985 |
| JP | 1-045131 | 2/1989 |
| JP | 1-246835 | 10/1989 |
| JP | 2-209729 | 8/1990 |
| JP | 2-304941 | 12/1990 |
| JP | 6-260473 | 9/1994 |
| JP | 7-142333 | 6/1995 |
| JP | 7-142441 | 6/1995 |
| JP | 7-171527 | 7/1995 |
| JP | 7-310192 | 11/1995 |
| JP | 8-186140 | 7/1996 |
| JP | 8-222508 | 8/1996 |
| JP | 9-213688 | 8/1997 |
| JP | 2000-114218 | 4/2000 |
| JP | 2001-77074 | 3/2001 |
| JP | 2004-317641 | 11/2004 |
| JP | 2004317641 * | 11/2004 |
| WO | WO 90/06189 | 6/1990 |

| | | |
|---|---|---|
| WO | WO 90/13675 | 11/1990 |
| WO | WO 93/14255 | 7/1993 |
| WO | WO 93/14259 | 7/1993 |
| WO | WO 93/20116 | 10/1993 |
| WO | WO 96/27704 | 9/1996 |
| WO | WO 99/49998 | 10/1999 |
| WO | WO 00/73241 A1 | 12/2000 |
| WO | WO 01/33613 A2 | 5/2001 |
| WO | WO 01/87505 A1 | 11/2001 |
| WO | WO 02/09894 A2 | 2/2002 |
| WO | WO 02/11191 A2 | 2/2002 |
| WO | WO 02/15251 A1 | 2/2002 |
| WO | WO 02/16051 A2 | 2/2002 |

OTHER PUBLICATIONS

"Los Almos National Laboratory," Solid State Technology, pp. S10 & S14, Oct. 1998.

"Supercritical Carbon Dioxide Resist Remover, SCORR, the Path to Least Photoresistance," Los Alamos National Laboratory, 1998.

Guan, Z. et al., "Fluorocarbon-Based Heterophase Polymeric Materials. 1. Block Copolymer Surfactants for Carbon Dioxide Applications," Macromolecules, vol. 27, 1994, pp. 5527-5532.

International Journal of Environmentally Conscious Design & Manufacturing, vol. 2, No. 1, 1993, p. 83.

Matson and Smith "Supercritical Fluids", Journal of the American Ceramic Society, vol. 72, No. 6, pp. 872-874.

Ziger, D.H. et al., "Compressed Fluid Technology: Application to RIE Developed Resists," AIChE Journal, vol. 33, No. 10, Oct. 1987, pp. 1585-1591.

Kirk-Othmer, "Alcohol Fuels to Toxicology," Encyclopedia of Chemical Terminology, 3rd ed., Supplement Volume, New York: John Wiley & Sons, 1984, pp. 872-893.

"Cleaning with Supercritical $CO_2$," NASA Tech Briefs, MFS-29611, Marshall Space Flight Center, Alabama, Mar. 1979.

Basta, N., "Supercritical Fluids: Still Seeking Acceptance," Chemical Engineering, vol. 92, No. 3, Feb. 24, 1985, p. 1-4.

Takahashi, D., "Los Alamos Lab Finds Way to Cut Chip Toxic Waste," Wall Street Journal, Jun. 22, 1998.

"Supercritical CO2 Process Offers Less Mess from Semiconductor Plants", Chemical Engineering Magazine, pp. 27 & 29, Jul. 1998.

Sun, Y.P. et al., "Preparation of Polymer-Protected Semiconductor Nanoparticles Through the Rapid Expansion of Supercritical Fluid Solution," Chemical Physics Letters, pp. 585-588, May 22, 1998.

Jackson, K. et al., "Surfactants and Micromulsions in Supercritical Fluids," Supercritical Fluid Cleaning. Noyes Publications, Westwood, NJ, pp. 87-120, Spring 1998.

Kryszewski, M., "Production of Metal and Semiconductor Nanoparticles in Polymer Systems," Polimery, pp. 65-73, Feb. 1998.

Bakker, G.L. et al., "Surface Cleaning and Carbonaceous Film Removal Using High Pressure, High Temperature Water, and Water/C02 Mixtures," J. Electrochem. Soc, vol. 145, No. 1, pp. 284-291, Jan. 1998.

Ober, C.K. et al., "Imaging Polymers with Supercritical Carbon Dioxide," Advanced Materials, vol. 9, No. 13, 1039-1043, Nov. 3, 1997.

Russick, E.M. et al., "Supercritical Carbon Dioxide Extraction of Solvent from Micro-machined Structures." Supercritical Fluids Extraction and Pollution Prevention, ACS Symposium Series, vol. 670, pp. 255-269, Oct. 21, 1997.

Dahmen, N. et al., "Supercritical Fluid Extraction of Grinding and Metal Cutting Waste Contaminated with Oils," Supercritical Fluids—Extraction and Pollution Prevention, ACS Symposium Series, vol. 670, pp. 270-279, Oct. 21, 1997.

Wai, C.M., "Supercritical Fluid Extraction: Metals as Complexes," Journal of Chromatography A, vol. 785, pp. 369-383, Oct. 17, 1997.

Xu, C. et al., "Submicron-Sized Spherical Yttrium Oxide Based Phosphors Prepared by Supercritical CO2-Assisted aerosolization and pyrolysis," Appl. Phys. Lett., vol. 71, No. 12, Sep. 22, 1997, pp. 1643-1645.

Tomioka Y, et al., "Decomposition of Tetramethylammonium (TMA) in a Positive Photo-resist Developer by Supercritical Water," Abstracts of Papers 214th ACS Natl Meeting, American Chemical Society, Abstract No. 108, Sep. 7, 1997.

Klein, H. et al., "Cyclic Organic Carbonates Serve as Solvents and Reactive Diluents," Coatings World, pp. 38-40, May 1997.

Bühler, J. et al., Linear Array of Complementary Metal Oxide Semiconductor Double-Pass Metal Micro-mirrors, Opt. Eng., vol. 36, No. 5, pp. 1391-1398, May 1997.

Jo, M.H. et al., Evaluation of SIO2 Aerogel Thin Film with Ultra Low Dielectric Constant as an Intermetal Dielectric, Microelectronic Engineering, vol. 33, pp. 343-348, Jan. 1997.

McClain, J.B. et al., "Design of Nonionic Surfactants for Supercritical Carbon Dioxide," Science, vol. 274, Dec. 20, 1996. pp. 2049-2052.

Znaidi, L. et al., "Batch and Semi-Continuous Synthesis of Magnesium Oxide Powders from Hydrolysis and Supercritical Treatment of Mg(OCH3)2," Materials Research Bulletin, vol. 31, No. 12, pp. 1527-1335, Dec. 1996.

Tadros, M.E., "Synthesis of Titanium Dioxide Particles in Supercritical CO2," J. Supercritical Fluids, vol. 9, pp. 172-176, Sep. 1996.

Courtecuisse, V.G. et al., "Kinetics of the Titanium Isopropoxide Decomposition in Supercritical Isopropyl Alcohol," Ind. Eng. Chem. Res., vol. 35, No. 8, pp. 2539-2545, Aug. 1996.

Gabor, A, et al., "Block and Random Copolymer resists Designed for 193 nm Lithography and Environmentally Friendly Supercritical CO2 Development,", SPIE, vol. 2724, pp. 410-417, Jun. 1996.

Schimek, G. L. et al., "Supercritical Ammonia Synthesis and Characterization of Four New Alkali Metal Silver Antimony Sulfides . . . ," J. Solid State Chemistry, vol. 123 pp. 277-284, May 1996.

Gallagher-Wetmore, P. et al., "Supercritical Fluid Processing: Opportunities for New Resist Materials and Processes," SPIE, vol. 2725, pp. 289-299, Apr. 1996.

Papathomas, K.I. et al., "Debonding of Photoresists by Organic Solvents," J. Applied Polymer Science, vol. 59, pp. 2029-2037, Mar. 28, 1996.

Watkins, J.J. et al., "Polymer/metal Nanocomposite Synthesis in Supercritical CO2," Chemistry of Materials, vol. 7, No. 11, Nov. 1995., pp. 1991-1994.

Gloyna, E.F. et al., "Supercritical Water Oxidation Research and Development Update," Environmental Progress, vol. 14, No. 3, pp. 182-192, Aug. 1995.

Gallagher-Wetmore, P. et al., "Supercritical Fluid Processing: A New Dry Technique for Photoresist Developing," SPIE vol. 2438, pp. 694-708, Jun. 1995.

Gabor, A. H. et al., "Silicon-Containing Block Copolymer Resist Materials," Microelectronics Technology—Polymers for Advanced Imaging and Packaging, ACS Symposium Series, vol. 614, pp. 281-298, Apr. 1995.

Tsiartas, P.C. et al., "Effect of Molecular weight Distribution on the Dissolution Properties of Novolac Blends," SPIE, vol. 2438, pp. 264-271, Jun. 1995.

Allen, R.D. et al., "Performance Properties of Near-monodisperse Novolak Resins," SPIE, vol. 2438, pp. 250-260, Jun. 1995.

Wood, P.T. et al., "Synthesis of New Channeled Structures in Supercritical Amines . . . ," Inorg. Chem., vol. 33, pp. 1556-1558, 1994.

Jerome, J.E. et al., "Synthesis of New Low-Dimensional Quaternary Compounds . . . ," Inorg. Chem, vol. 33, pp. 1733-1734, 1994.

McHardy, J. et al., "Progress in Supercritical CO2 Cleaning," SAMPE Jour., vol. 29, No. 5, pp. 20-27, Sep. 1993.

Purtell, R, et al., "Precision Parts Cleaning using Supercritical Fluids," J. Vac, Sci, Technol. A. vol. 11, No. 4, Jul. 1993, pp. 1696-1701.

Bok, E, et al., "Supercritical Fluids for Single Wafer Cleaning," Solid State Technology, pp. 117-120, Jun. 1992.

Adschiri, T. et al., "Rapid and Continuous Hydrothermal Crystallization of Metal Oxide Particles in Supercritical Water," J. Am. Ceram. Soc., vol. 75, No. 4, pp. 1019-1022, 1992.

Hansen, B.N. et al., "Supercritical Fluid Transport—Chemical Deposition of Films," Chem. Mater., vol. 4, No. 4, pp. 749-752, 1992.

Page, S.H. et al., "Predictability and Effect of Phase Behavior of CO2/ Propylene Carbonate in Supercritical Fluid Chromatography," J. Microcol, vol. 3, No. 4, pp. 355-369, 1991.

Brokamp, T. et al., "Synthese und Kristallstruktur Eines Gemischtvalenten Lithium-Tantalnitrids Li2Ta3N5," J. Alloys and Compounds, vol. 176. pp. 47-60, 1991.

Hybertson, B.M. et al., "Deposition of Palladium Films by a Novel Supercritical Fluid Transport Chemical Deposition Process," Mat. Res. Bull., vol. 26, pp. 1127-1133, 1991.

Ziger, D. H. et al., "Compressed Fluid Technology: Application to RIE-Developed Resists," AiChE Jour., vol. 33, No. 10, pp. 1585-1591, Oct. 1987.

Matson, D.W. et al., "Rapid Expansion of Supercritical Fluid Solutions: Solute Formation of Powders, Thin Films, and Fibers," Ind. Eng. Chem. Res., vol. 26, No. 11, pp. 2298-2306, 1987.

Tolley, W.K. et al., "Stripping Organics from Metal and Mineral Surfaces using Supercritical Fluids," Separation Science and Technology, vol. 22, pp. 1087-1101, 1987.

"Final Report on the Safety Assessment of Propylene Carbonate", J. American College of Toxicology, vol. 6, No. 1, pp. 23-51, 1987.

"Porous Xerogel Films as Ultra-Low Permittivity Dielectrics for ULSI Interconnect Applications", Materials Research Society, pp. 463-469, 1997.

Kawakami et al, "A Super Low-k (k=1.1) Silica Aerogel Film Using Supercritical Drying Technique", IEEE, pp. 143-145, 2000.

R.F. Reidy, "Effects of Supercritical Processing on Ultra Low-K Films", Texas Advanced Technology Program, Texas Instruments, and the Texas Academy of Mathematics and Science.

Anthony Muscat, "Backend Processing Using Supercritical CO2", University of Arizona.

D. Goldfarb et al., "Aqueous-based Photoresist Drying Using Supercritical Carbon Dioxide to Prevent Pattern Collapse", J. Vacuum Sci. Tech. B 18 (6), 3313 (2000).

H. Namatsu et al., "Supercritical Drying for Water-Rinsed Resist Systems", J. Vacuum Sci. Tech. B 18 (6), 3308 (2000).

N. Sundararajan et al., "Supercritical CO2 Processing for Submicron Imaging of Fluoropolymers", Chem. Mater. 12, 41 (2000).

* cited by examiner

METHOD OF TREATING A COMPOSITE SPIN-ON GLASS/ANTI-REFLECTIVE MATERIAL PRIOR TO CLEANING

CROSS-REFERENCE TO RELATED APPLICATIONS

This patent application is related to commonly owned copending U.S. patent application Ser. No. 11/094,876 filed Mar. 30, 2005, and entitled "ISOTHERMAL CONTROL OF A PROCESS CHAMBER"; U.S. patent application Ser. No. 11/094,938 filed Mar. 30, 2005, and entitled "NEUTRALIZATION OF SYSTEMIC POISONING IN WAFER PROCESSING"; U.S. patent application Ser. No. 11/094,936 filed Mar. 30, 2005, and entitled "GATE VALVE FOR PLUS-ATMOSPHERIC PRESSURE SEMICONDUCTOR PROCESS VESSELS"; U.S. patent application Ser. No. 11/094,882 filed Mar. 30, 2005, and entitled "REMOVAL OF POROGENS AND POROGEN RESIDUES USING SUPERCRITICAL $CO_2$"; U.S. patent application Ser. No. 11/095,827 filed Mar. 30, 2005, and entitled "METHOD OF INHIBITING COPPER CORROSION DURING SUPERCRITICAL $CO_2$ CLEANING"; and U.S. patent application Ser. No. 10/379,984 filed Mar. 4, 2003, and entitled "METHODS OF PASSIVATING POROUS LOW-K DIELECTRIC FILM", which are all hereby incorporated by reference in their entirety.

FIELD OF THE INVENTION

The present invention relates to the field of microelectronic device processing. More particularly, the present invention relates to methods of processing a spin-on glass/anti-reflective material without substantially altering a dielectric characteristic of a dielectric layer having a low dielectric constant (low-k), in the fabrication of semiconductor devices.

BACKGROUND OF THE INVENTION

The fabrication of semiconductor devices such as integrated circuits and micro electro-mechanical system (MEMS) devices typically involves multiple processing steps. As part of the fabrication process, a masking process referred to as photolithography or photomasking is used to transfer a pattern onto a semiconductor substrate. Photolithography generally involves reproducing an image from a mask in a layer of photoreactive polymer or photoresist that is supported by underlying layers of a semiconductor substrate. In the photolithography process, an optical mask is positioned between an irradiation source and the photoresist layer. The image is reproduced by exposing the photoresist to light or radiation energy through the optical mask. In a typical semiconductor manufacturing process, an etching process is employed in which the pattern of the photoresist mask layer is etched into underlying layers of the substrate. The layers underlying the photoresist layer generally include one or more layers that are to be patterned. When an etching process is employed in the manufacture of semiconductor devices, the complete removal of photoresist, photoresist residues and other residues and contaminants from the etched surface is desired in order to achieve high yield. The removal of the photoresist, photoresist residue and other residues and contaminants such as residual etching reactants and by products is commonly known as stripping.

One challenge in photolithography is the difficulty of obtaining uniform exposure of the photoresist layer. For example, standing wave patterns (normally incident light forms standing waves because of constructive and destructive interference) and reflective notching can occur due to the optical properties of the layers underlying the photoresist and due to the varying thickness of the photoresist. As shorter wavelengths are being used in the photolithography process to allow patterning of smaller features, interference effects become more pronounced.

As semiconductor device feature sizes decrease with advancing technologies, smaller geometries can require thinner photoresist layers for enhanced depth of focus. It can be desirable to provide a bottom anti-reflective coating (BARC) beneath the photoresist for purposes of minimizing optical reflection of the light used to expose the pattern in the photoresist. The reduction of optical reflection reduces or eliminates the interference patterns of radiation within the photoresist layer. Anti-reflective coatings are generally classified either based on the material used—into inorganic and organic anti-reflective coatings—or based on the operation mechanism—into absorptive and interfering anti-reflective coatings. Organic anti-reflective materials work to prevent reflectivity by matching the refractive index of the anti-reflective material with that of the resist. If there is no difference in the respective refractive indices, then there will be no optical reflection at the photoresist-BARC interface. Some organic anti-reflective materials are designed to absorb light energy passing through the photoresist layer. Absorption is desired to control scattered light energy reflecting from the substrate back up into the photoresist. The use of a BARC layer can improve the photolithography process control by reducing or eliminating standing waves and reflective notching, thereby improving critical dimension control.

High performance, high-density integrated circuits (ICs) can contain tens of millions of transistors. There is a constant push to increase the number of transistors on wafer-based ICs. With the decreasing size of semiconductor devices and an increasing density of transistors, there is a need to prevent undesired capacitive interactions between the adjacent metal lines of the metallization scheme and/or conductive regions of an integrated circuit (commonly referred to as "parasitic capacitance," "capacitive coupling" or "cross-talk") in order to allow high-performance signal processing. The semiconductor industry is continually looking for new materials and new processes to improve the performance of wafer-based ICs.

Generally, materials with a dielectric constant (k) of lower than 3.9 are referred to as low-k materials. Porous materials with a dielectric constant of 2.5 and lower are generally referred to as ultra low-k materials. For the purposes of this disclosure, "low-k materials" encompasses both low-k and ultra low-k materials. Low-k materials have been used in advanced ICs to minimize interconnection resistance-capacitance time delays, thereby increasing the speed of signal propagation. Low-k materials have been shown to reduce cross-talk, thereby facilitating the fabrication of smaller feature geometries and more complex micro devices. Low-k materials have been used for low-temperature processing. For example, spin-on glass (SOG) materials and polymers can be coated onto a substrate, such as a semiconductor substrate, and treated or cured under relatively low temperature to form porous silicon oxide-based low-k layers. Dual-damascene processes (techniques for the simultaneous formation of a conductive plug in electrical contact with a conductive line) involving low-k materials are also known. Low-k materials can be deposited on a substrate by any of chemical vapor deposition (CVD), plasma enhanced chemical vapor deposition (PECVD), or spin-on techniques. For example, low-k materials such as carbon-doped oxide or fluoridated silicon glass can be formed on a substrate by performing a CVD process, while other low-k materials, such as methyl silsesquioxane (MSQ), porous-MSQ and porous silica, can be deposited using a spin-on process.

FIG. 1 shows a schematic cross-sectional view of a prior art semiconductor device manufacturing method including a BARC (130) layer formed on a conventionally prepared dielectric material (110), which in turn is formed on a semiconductor substrate (100), (not to scale). FIG. 1 also shows a photoresist (150) formed on the BARC (130) layer.

While low-k materials have been used in the fabrication of advanced micro circuitry, the lower density, reduced mechanical properties, and typically increased organic content of low-k materials present fabrication challenges. For example, due to the porosity and higher concentration of carbon in low-k materials, the materials are susceptible to damage by conventional etch and plasma ashing processes. Plasma ashing is the process of removing the photoresist and the etch polymer residues from an etched wafer. In traditional plasma strip processes, a reactive species, such as oxygen or fluorine, combines with the resist to form ash that is removed with a vacuum pump. One problem is that conventional etch and plasma ashing processes can oxidize the carbon within the low-k material itself, altering its k value. For example, porous MSQ film, which is hydrophobic and not susceptible to water absorption, exhibits significant loss of carbon species and suffers increased water absorption and dielectric constant after exposure to ash and wet clean processes. Further, silicon oxide-based low-k materials tend to be highly reactive after patterning steps, such as conventional photolithography. The hydrophilic surface of the silicon oxide-based low-k material can readily absorb water and/or react with other vapors and/or process contaminants, which can alter a dielectric characteristic of the dielectric layer itself and/or diminish the ability to further process the wafer.

There is a need for effective stripping processes to achieve improved device performance with higher productivity and reduced production costs. There is a need for effective stripping processes to completely remove the photoresist and underlying BARC layer, without altering of a dielectric characteristic of a dielectric layer having a low dielectric constant (low-k). There is a need for removing contaminants and particles from a fluid such as carbon dioxide.

SUMMARY OF THE INVENTION

A first embodiment of the present invention is a method of treating a SOG/anti-reflective material prior to a post-etch cleaning process, wherein the SOG/anti-reflective material is formed on a low-k dielectric layer which in turn is formed on a substrate. For purposes of this document, the term "SOG/anti-reflective material" means a composite of SOG and anti-reflective materials formed in a single layer. The method comprises the steps of patterning the SOG/anti-reflective material and the low-k dielectric layer; treating the SOG/anti-reflective material with a curing solution; and removing the curing solution and the SOG/anti-reflective material. Preferably the curing step is performed under supercritical conditions.

A second embodiment of the invention is a method of cleaning a microelectronic device, comprising the steps of: providing a substrate having a patterned SOG/anti-reflective material to be cleaned; performing a process to cure the patterned SOG/anti-reflective material; and performing a cleaning process to remove the cured SOG/anti-reflective material. Preferably the curing step is performed in a supercritical environment.

A third embodiment of the invention is a method of cleaning a microelectronic device, comprising the steps of: providing a substrate having a patterned SOG/anti-reflective material to be cleaned; providing a curing solution; contacting the SOG/anti-reflective material with the curing solution, preferably under supercritical conditions; removing the curing solution from the patterned SOG/anti-reflective material; providing a cleaning fluid; and contacting the SOG/anti-reflective material with the cleaning fluid to remove the SOG/anti-reflective material.

A fourth embodiment is a method of fabricating an microelectronic device, comprising the steps of: forming an interlayer insulation film comprising a low-k dielectric material on a semiconductor substrate; forming a SOG/anti-reflective material on the interlayer insulation film; forming a photoresist on the SOG/anti-reflective material; patterning the photoresist; patterning the SOG/anti-reflective material and the interlayer insulation film using the photoresist as a mask; removing the photoresist; contacting the SOG/anti-reflective material with a curing solution, preferably under supercritical conditions; and cleaning the low-k dielectric material.

A fifth embodiment is an apparatus for cleaning a microelectronic device. The apparatus includes a processing chamber including a substrate holder. The apparatus includes means for pressurizing the processing chamber. The apparatus includes means for performing a SOG/anti-reflective material curing process within the processing chamber. Preferably, the apparatus includes means for generating supercritical conditions. The apparatus also includes means for performing a cleaning process within the processing chamber and means for venting the processing chamber.

BRIEF DESCRIPTION OF THE DRAWINGS

A more complete appreciation of various embodiments of the invention and many of the attendant advantages thereof will become readily apparent with reference to the following detailed description, particularly when considered in conjunction with the accompanying drawings, in which.

DETAILED DESCRIPTION OF SEVERAL EMBODIMENTS

The present invention is directed to methods of stripping a spin-on glass (SOG)/anti-reflective material without substantially altering a dielectric characteristic of a dielectric layer having a low dielectric constant (low-k), in the fabrication of semiconductor devices. For the purposes of the invention and this disclosure, "fluid" means a gaseous, liquid, supercritical, and/or near-supercritical fluid. In certain embodiments of the invention, "fluid" means gaseous, liquid, supercritical, and/or near-supercritical carbon dioxide. It should be appreciated that solvents, co-solvents, chemistries, and/or surfactants can be contained in or added to the fluid. For purposes of the invention, "carbon dioxide" should be understood to refer to carbon dioxide ($CO_2$) employed as a fluid in a liquid, gaseous or supercritical (including near-supercritical) state. "Supercritical carbon dioxide" refers herein to $CO_2$ at conditions above the critical temperature (approximately 31° C.) and critical pressure (approximately 7.38 MPa). When $CO_2$ is subjected to pressures and temperatures above the supercritical pressure and supercritical temperature, it is determined to be in the supercritical state. "Near-supercritical carbon dioxide" refers to $CO_2$ within about 85% of critical temperature and critical pressure. As used herein, "substrate" includes a wide variety of structures such as semiconductor device structures for forming integrated circuits, opto-electronic devices, micro electromechanical system (MEMS) devices, and/or micro-opto-electro-mechanical system (MOEMS) devices. A substrate can be a single layer of material, such as a silicon wafer, or can include any number of layers. A substrate can comprise various materials, including metals, ceramics, glass, or compositions thereof. For the purposes of the invention and this disclosure, "SOG/anti-reflective material" refers to a composite of SOG and anti-reflective materials formed in a single layer, including composites of SOG and inorganic and/or organic anti-reflective materials. It should be appreciated that the term "SOG/anti-reflective material" encompasses uncured SOG/anti-reflective material, partially-cured SOG/anti-reflective material, substantially-cured SOG/anti-reflective material, and cured SOG/anti-reflective material.

FIGS. 2A-2E show a series of schematic cross-sectional diagrams illustrating the formation of a patterned low-k dielectric layer on a semiconductor substrate, in accordance with embodiments of the present invention, not to scale. The semiconductor substrate 200 can comprise Si, Ge, Si/Ge, or GaAs. A dielectric layer 210 can be deposited on the semiconductor substrate 200, and a SOG/anti-reflective material 230 can be formed on the dielectric layer 210. A photoresist 250 is formed on the surface of the SOG/anti-reflective material 230.

Figure 1:
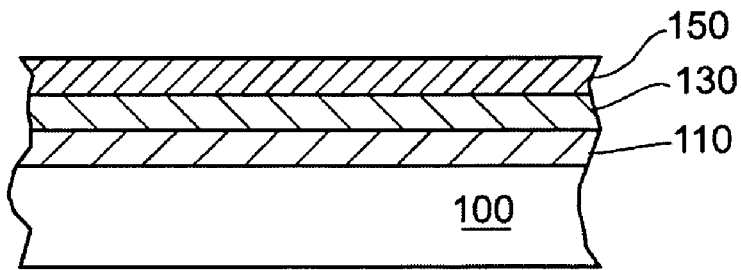
FIG. 1 shows a schematic cross-sectional view of a prior art semiconductor device manufacturing method including a bottom anti-reflective coating (BARC) formed on a conventionally prepared dielectric material, (not to scale)
Figure 2A:
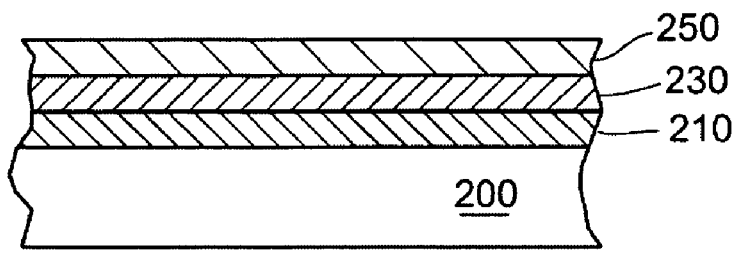
FIGS. 2A-2E illustrate a series of schematic cross-sectional diagrams illustrating the formation of a patterned low-k dielectric layer on a semiconductor substrate, in accordance with embodiments of the present invention, (not to scale)
Figure 2B:
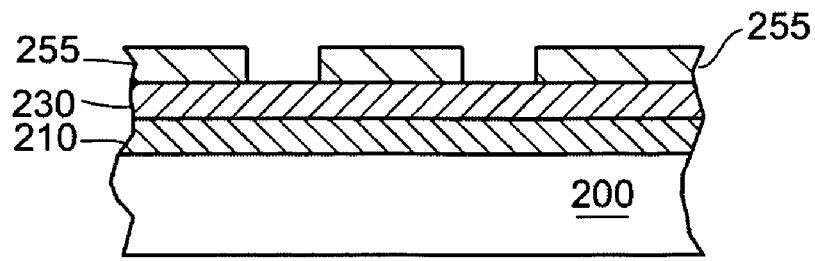

In one embodiment, the photoresist 250 shown in FIG. 2A is exposed and developed to form the patterned photoresist shown in FIG. 2B. Next, an etch process can be performed to etch through the SOG/anti-reflective material 230 and the dielectric layer 210 to form the patterned layers including the patterned SOG/anti-reflective patterned layer 234 and the patterned low-k dielectric layer 215 shown in FIG. 2C.

Figure 2C:
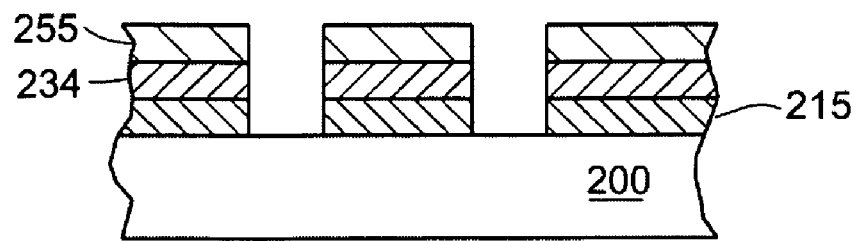

The present invention contemplates a variety of means for producing the patterned layer structures shown in FIG. 2C. In one embodiment, the patterned photoresist 255 is used as an etch mask. In an alternative embodiment, a multi-step etch process may be performed in which the patterned photoresist 255 may be used as an etch mask to first etch the SOG/anti-reflective material 230 and then the patterned photoresist 255 and/or a patterned SOG/anti-reflective layer may be used to etch the dielectric layer 210.

After etch, a cleaning process is performed to remove the patterned photoresist 255 and which also affects the patterned SOG/anti-reflective layer 234 shown in FIG. 2C is performed. Following the cleaning process, a layer 238 shown in FIG. 2D and including at least a portion of the patterned layer of SOG/anti-reflective material 234 is present on the surfaces of the patterned low-k dielectric 215. The layer 238 forms via interactions between the SOG/anti-reflective material and the chemistries used in the cleaning process. For example, the layer 238 can be SOG/anti-reflective material that has been altered by the etch process. It should be appreciated that photoresist, photoresist residue, and/or other residues and contaminants such as residual etching reactants and byproducts also can be present on the surfaces of the patterned low-k dielectric layer 215 and/or the substrate 200.

According to the one embodiment of the present invention, the layer 238, comprising SOG/anti-reflective material, is treated with a curing solution. The layer 238 is treated with the curing solution for a sufficient period of time to facilitate the removal of the layer 238, including all SOG/anti-reflective material therein. The curing solution preferably facilitates the removal of the layer 238, and all SOG/anti-reflective material therein, without substantially altering a dielectric characteristic of the patterned low-k dielectric 215. Preferably, at least one portion of the curing is performed under supercritical conditions.

Figure 2D:
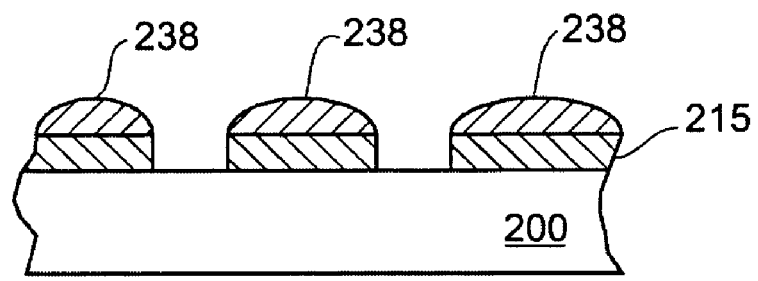
Figure 2E:
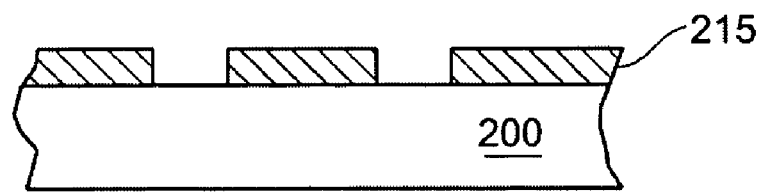

Next, a cleaning process is performed to remove the curing solution and the SOG/anti-reflective material 238 shown in FIG. 2D. After the cleaning process, only the patterned low-k dielectric 215 remains on the semiconductor substrate 200, as illustrated in FIG. 2E. Preferably, at least one portion of the cleaning process is performed under supercritical conditions.

Figure 3:
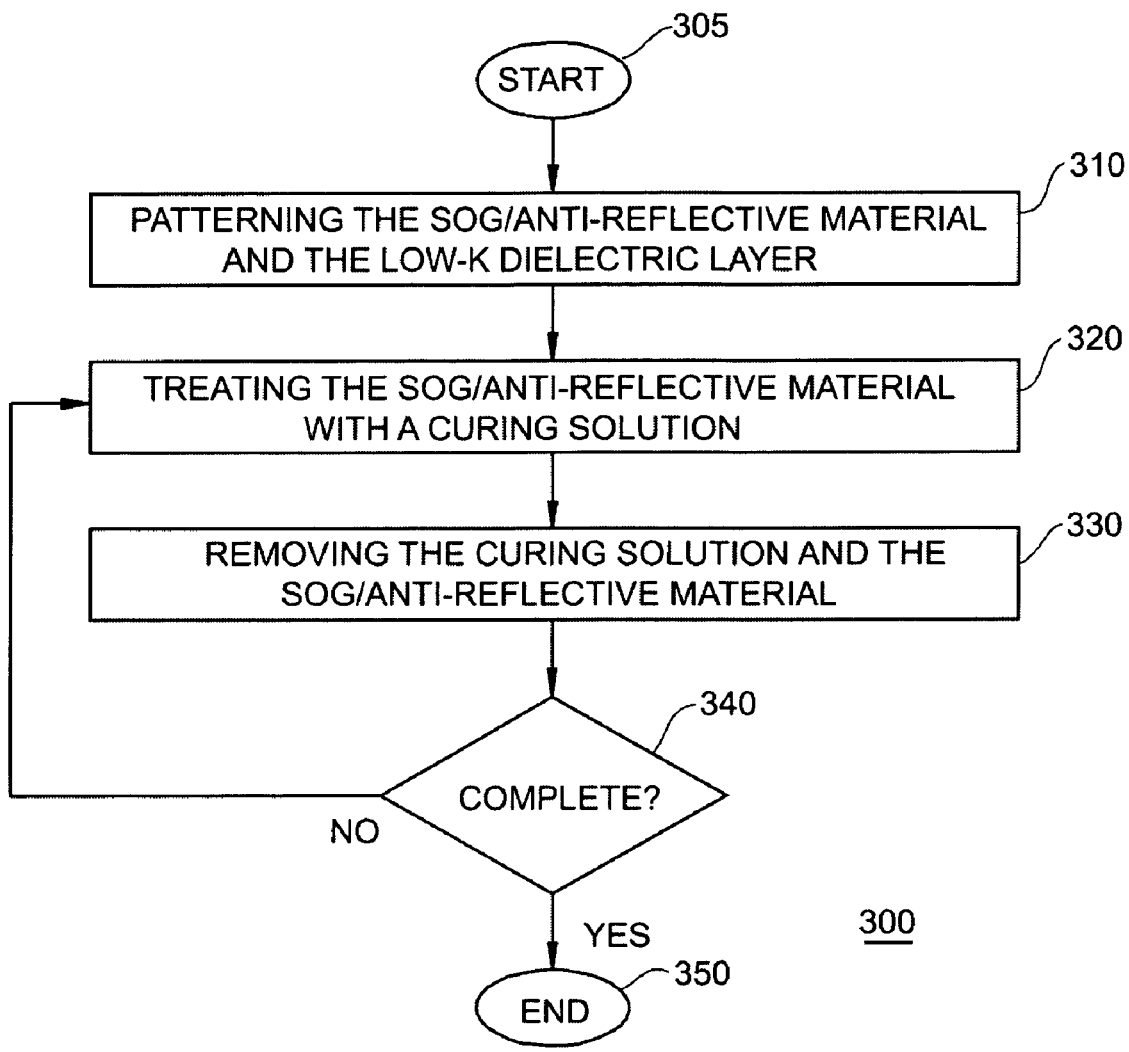
FIG. 3 shows a flow chart of a method for treating a SOG/anti-reflective material prior to a post-etch cleaning process in accordance with the present invention.

FIG. 3 shows a flow chart of a method for treating a SOG/anti-reflective material in accordance with the invention. Procedure 300 starts in step 305. In the illustrated embodiment, the SOG/anti-reflective material is patterned and cured prior to a post-etch cleaning process. The SOG/anti-reflective material can be formed on a low-k dielectric layer that in turn can be formed on a substrate. It should be appreciated that any type of low-k material, inorganic or organic, such as but not limited to hydrogen silsesquioxane (HSQ), methyl silsesquioxane (MSQ), hydro polysilsesquioxane (H—PSSQ), methyl polysilsesquioxane (M-PSSQ), phenyl polysilsesquioxane (P—PSSQ), FLARE™, SILK™, Xerogel™, Nanoglass™, PAE-2, HOSP, and porous sol-gel, is suitable for implementing the present invention. While the invention contemplates use of any suitable means for forming the low-k dielectric layer on the substrate, in certain embodiments, the low-k dielectric layer is formed on the substrate by chemical vapor deposition (CVD), plasma enhanced chemical vapor deposition (PECVD), and/or spin-on techniques. In one embodiment, the low-k dielectric layer comprises a low-k inter-metal-dielectric (IMD) layer. In one embodiment, the SOG/anti-reflective material formed on the low-k IMD layer comprises a dual damascene interconnection layer formed employing a SOG/anti-reflective material formed on the low-k IMD layer.

In step 310, the SOG/anti-reflective material layer and the low-k dielectric layer are patterned. In one embodiment of the invention, the SOG/anti-reflective material and the low-k dielectric layer are patterned using an etching process. It should be appreciated that the etching process can be a dry etching process, such as plasma etching, or a wet chemical etching process. Furthermore, the etching process can comprise one or more etching steps.

In step 320, the SOG/anti-reflective material is treated with a curing solution, preferably under supercritical conditions. In one embodiment, the curing process uses supercritical $CO_2$ and a low molecular weight organic acid, methylsulfonic acid, or gaseous ammonia, or combinations thereof during at least one process step. Preferably, the SOG/anti-reflective material is treated with the curing solution for a sufficient period of time to facilitate the removal of the SOG/anti-reflective material. Preferably, the curing solution facilitates the removal of the SOG/anti-reflective material without substantially altering a dielectric characteristic of the patterned low-k dielectric.

In step 330, the curing solution and the SOG/anti-reflective material are removed. In one embodiment, the removal process can comprise one or more steps performed under supercritical conditions. Alternatively, supercritical processing is not required.

In step 340, a query is performed to determine when the treating process has been completed. When the treating process has been completed, procedure 300 branches to step 350, and procedure 300 ends. When the treating process has not been completed, procedure 300 branches to step 320, and procedure 300 continues as shown in FIG. 3.

Figure 4:
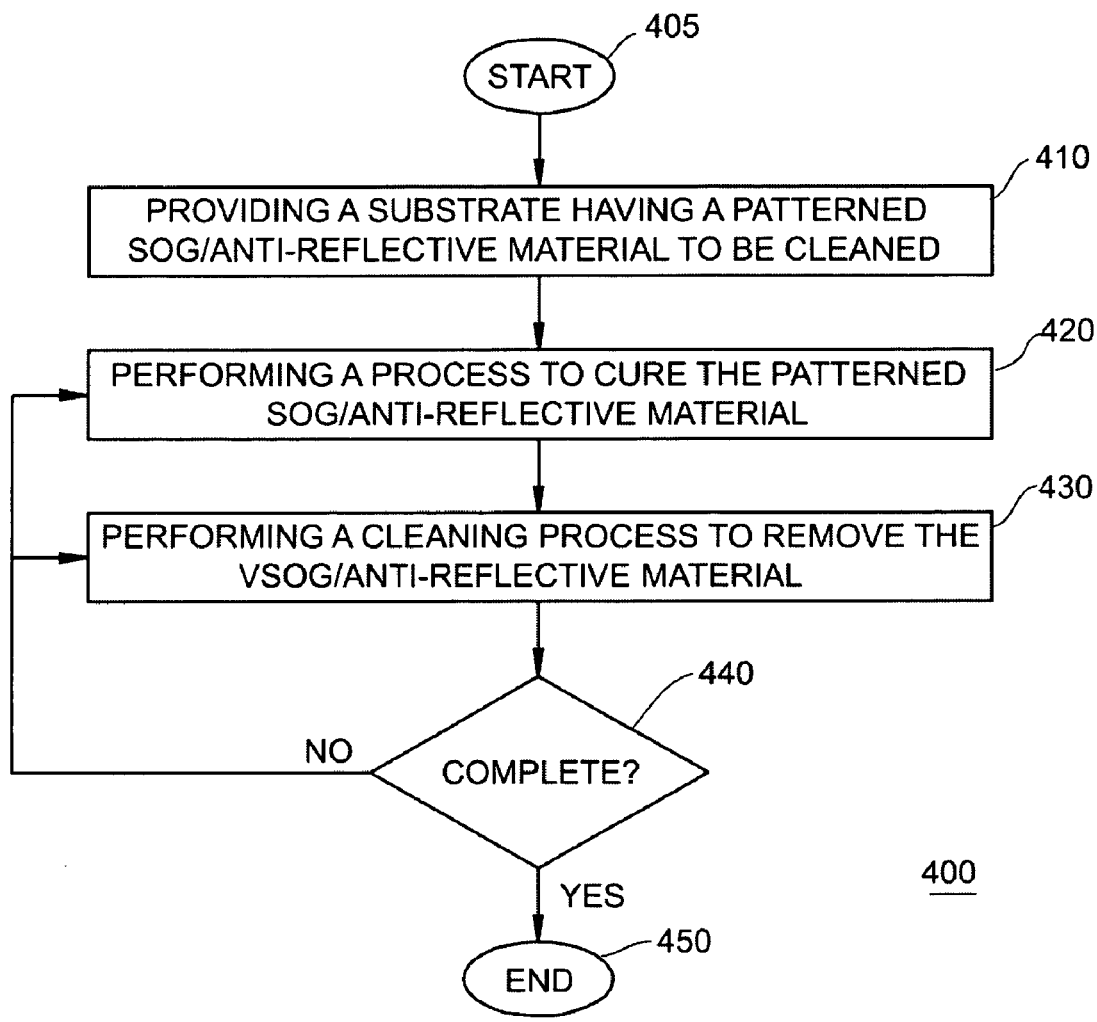
FIG. 4 shows a flow chart of a method for cleaning a microelectronic device in accordance with the present invention.

FIG. 4 shows a flow chart of a method for cleaning a microelectronic device in accordance with the present invention. Procedure 400 starts in step 405. In the illustrated embodiment, a substrate comprising patterned SOG/anti-reflective material is cleaned. In step 410, a substrate is provided having a patterned SOG/anti-reflective material to be cleaned. It should be appreciated that the substrate can be a semiconductor substrate for forming an integrated circuit, an opto-electronic device, a micro electro-mechanical system (MEMS) device, and/or a micro-opto-electro-mechanical system (MOEMS) device. In one embodiment, the substrate includes a low-k dielectric layer. While the invention contemplates use of any suitable inorganic or organic low-k material, in one embodiment, the low-k dielectric layer is selected from the group consisting of hydrogen silsesquioxane (HSQ), methyl silsesquioxane (MSQ), hydrio polysilsesquioxane (H—PSSQ), methyl polysilsesquioxane (M-PSSQ), phenyl polysilsesquioxane (P—PSSQ), FLARE™, SILK™, Xerogel™, Nanoglass™, PAE-2, HOSP, and porous sol-gel. It should be appreciated that any means for forming the low-k dielectric layer on the substrate should be suitable for implementing the present invention, such as but not limited to chemical vapor deposition (CVD), plasma enhanced chemical vapor deposition (PECVD), and spin-on techniques. In one embodiment, the low-k dielectric layer comprises a low-k inter-metal-dielectric (IMD) layer. In one embodiment, the SOG/anti-reflective material formed on the low-k IMD layer comprises a dual damascene interconnection layer formed employing a SOG/anti-reflective material formed on the low-k IMD layer.

In step 420, a process is performed to cure the patterned SOG/anti-reflective material. In one embodiment of the present invention, the step of performing a process to cure the patterned SOG/anti-reflective material comprises contacting the SOG/anti-reflective material with a curing solution, preferably under supercritical conditions. The curing solution comprises at least one of low molecular weight organic acid such as, but not limited to, formic acid or acetic acid, methylsulfonic acid, or gaseous ammonia, or combinations thereof. During the curing process, the SOG/anti-reflective material is treated with the curing solution for a sufficient period of time to facilitate the removal of the SOG/anti-reflective material without substantially altering dielectric characteristic of the patterned low-k dielectric.

In step 430, a cleaning process is performed to remove the cured SOG/anti-reflective material. In one embodiment of the invention, the cleaning process includes the steps of introducing a cleaning chemistry into a processing chamber containing the SOG/anti-reflective material; pressurizing the processing chamber; and recirculating the cleaning chemistry within and/or through the processing chamber. The cleaning chemistry comprises at least one of gaseous, liquid, supercritical, and near-supercritical carbon dioxide. It should be appreciated that solvents, co-solvents, chemistries, and/or surfactants can be contained in the carbon dioxide. In an alternative embodiment of the invention, the cleaning process includes the steps of: pressurizing a processing chamber containing the SOG/anti-reflective material to a first pressure above a supercritical threshold pressure; introducing a cleaning chemistry into the processing chamber; increasing a pressure of the processing chamber to a second pressure; recirculating the cleaning chemistry within and/or through the processing chamber; and performing a series of decompression cycles.

In one embodiment, the curing process performed in step 420 can comprise one or more steps performed under supercritical conditions. Alternatively, supercritical processing is not required for curing. In addition, the cleaning process can comprise one or more steps performed under supercritical conditions. Alternatively, supercritical processing is not required for cleaning.

In step 440, a query is performed to determine when the cleaning process has been completed. When the cleaning process has been completed, procedure 400 branches to step 450, and procedure 400 ends. When the cleaning process has not been completed, procedure 400 branches to step 420, and procedure 400 continues as shown in FIG. 4. Alternatively, procedure 400 branches to step 430, and continues as shown in FIG. 4.

Figure 5:
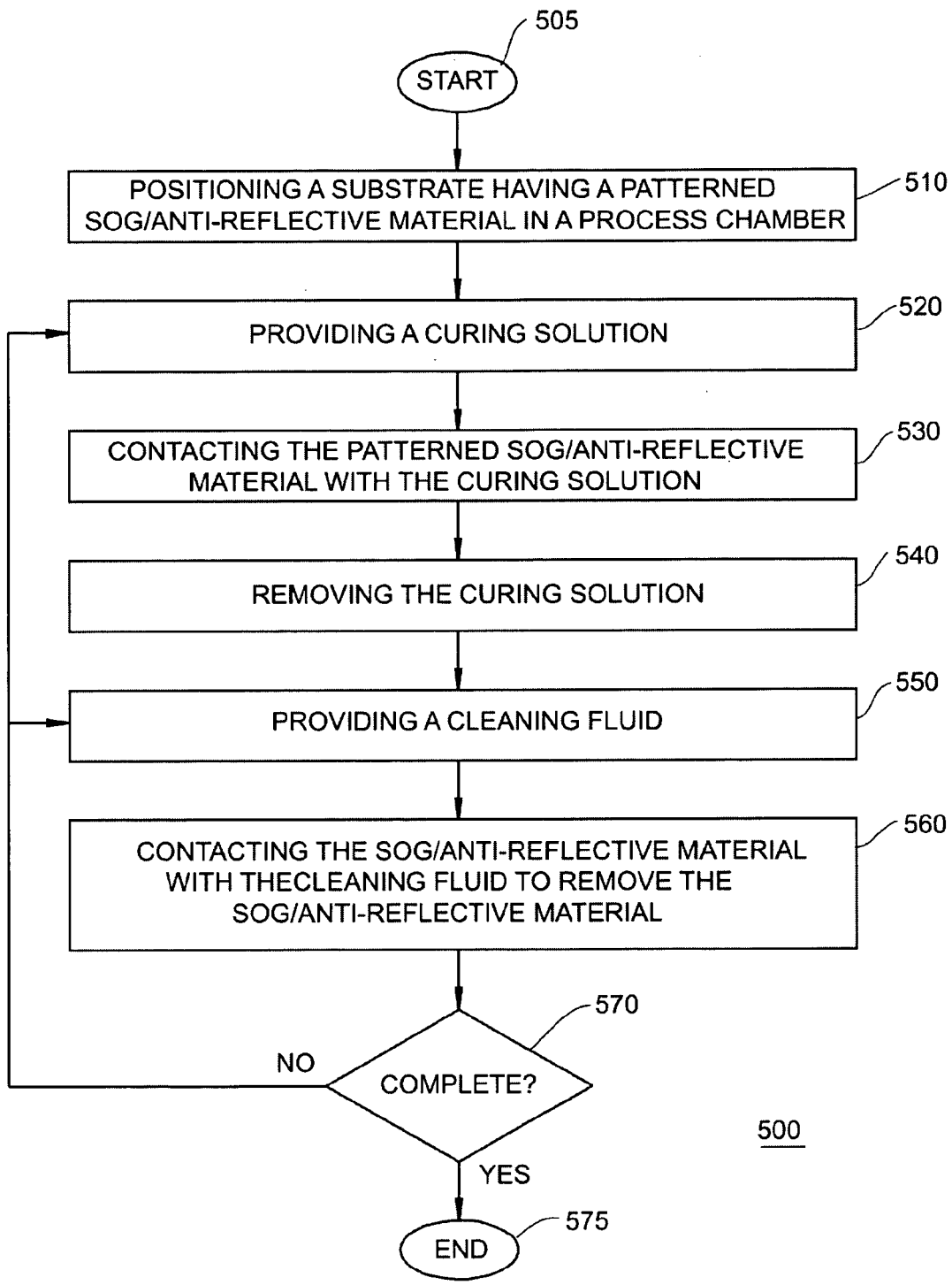
FIG. 5 shows a flow chart of a method for cleaning a microelectronic device in accordance with the present invention.

FIG. 5 shows a flow chart of a method for cleaning a microelectronic device in accordance with the present invention. Procedure 500 starts in step 505. In the illustrated embodiment, one or more curing processes and one or more cleaning processes can be performed on a substrate comprising patterned SOG/anti-reflective material. In step 510, a substrate having a patterned SOG/anti-reflective material is positioned in a process chamber. The substrate can comprise a semiconductor substrate for forming an integrated circuit, an opto-electronic device, a micro electro-mechanical system (MEMS) device, and/or a micro-opto-electro-mechanical system (MOEMS) device. In one embodiment, the substrate further comprises a low-k dielectric layer.

In step 520, a curing solution is provided. Preferably, the curing solution comprises at least one of low molecular weight organic acid, such as, but not limited to, formic acid or acetic acid, methylsulfonic acid, gaseous ammonia, and combinations thereof. In step 530, the patterned SOG/anti-reflective material is contacted with the curing solution, preferably under supercritical conditions. Preferably, the curing solution facilitates the removal of the SOG/anti-reflective material without substantially altering the dielectric characteristics of the patterned low-k dielectric. In step 540, the curing solution is removed from the SOG/anti-reflective material, and preferably removed from a processing chamber.

In step 550, a cleaning fluid is provided to the SOG/anti-reflective material within a processing chamber. The cleaning fluid can comprise at least one of gaseous, liquid, supercritical, and near-supercritical carbon dioxide. It should be appreciated that solvents, co-solvents, chemistries, and/or surfactants can be contained in the carbon dioxide.

In step 560, the cured and/or uncured SOG/anti-reflective material is contacted with the cleaning fluid to remove the cured and/or uncured SOG/anti-reflective material. In one embodiment, supercritical processing with a fluid is performed to remove the cured and/or uncured SOG/anti-reflective material and photoresist, photoresist residue, and/or other residues and contaminants such as residual etching reactants and byproducts. The details concerning one example of the use of supercritical processing to remove residues and contaminants are disclosed in co-owned and co-pending U.S. patent application Ser. No. 10/394,802, filed Mar. 21, 2003 and entitled "REMOVAL OF CONTAMINANTS USING SUPERCRITICAL PROCESSING," the contents of which are incorporated herein by reference.

In one embodiment, the curing process can comprise one or more steps performed under supercritical conditions. Alternatively, supercritical processing is not required for curing. In addition, the cleaning process can comprise one or more steps performed under supercritical conditions. Alternatively, supercritical processing is not required for cleaning.

In step 570, a query is performed to determine when the curing/cleaning process of procedure 500 has been completed. When the curing/cleaning process has been completed, procedure 500 branches to step 575, and procedure 500 ends. When the curing/cleaning process has not been completed, procedure 500 branches to step 520, and procedure 500 continues as shown in FIG. 5. Alternatively, procedure 500 branches to step 550 and continues as shown in FIG. 5.

Figure 6:
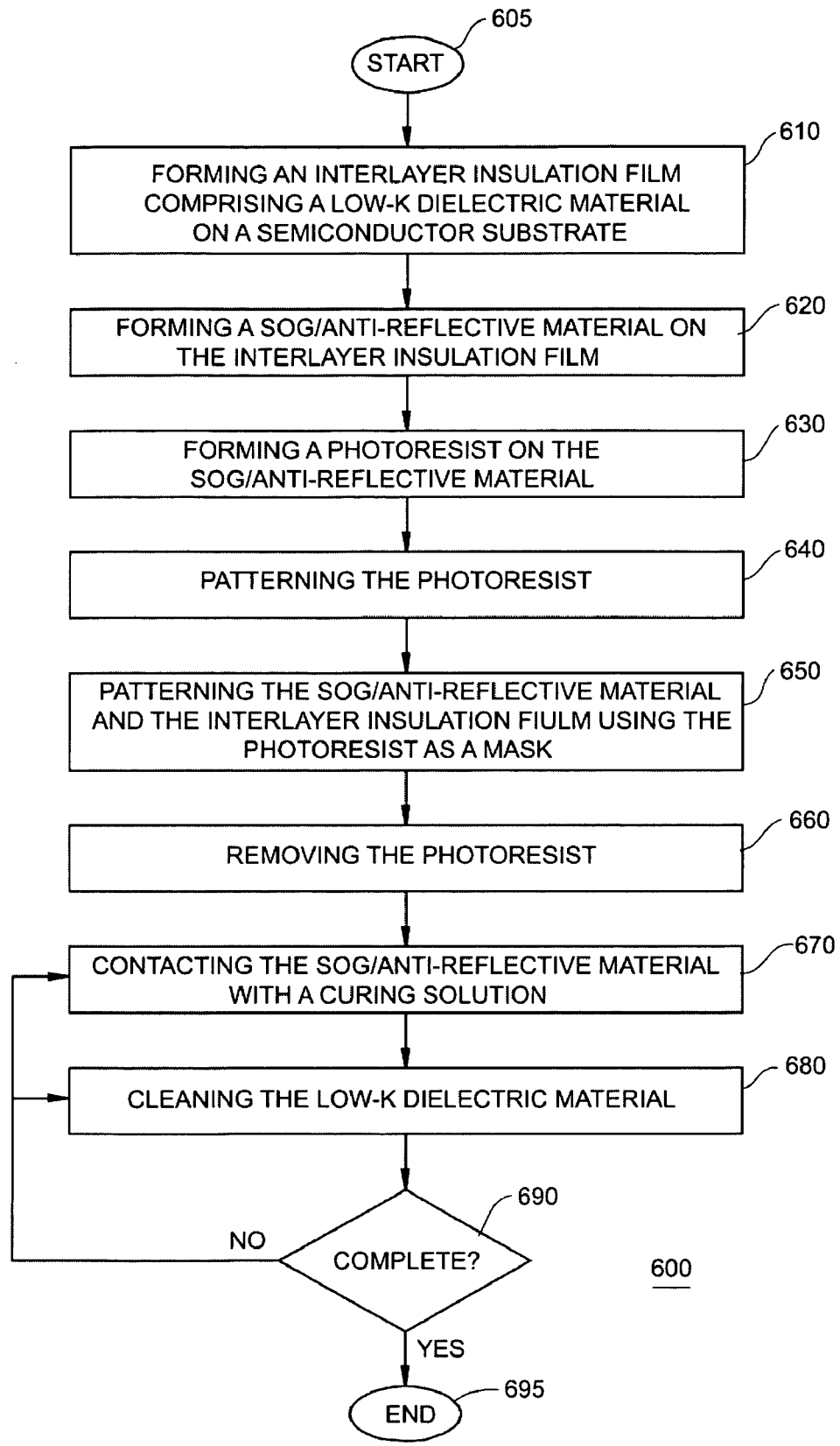
FIG. 6 shows a flow chart of a method for fabricating a microelectronic device in accordance with the present invention.

FIG. 6 shows a flow chart of a method for fabricating a microelectronic device in accordance with the present invention. Procedure 600 starts in step 605. In the illustrated embodiment, one or more processes can be performed on a substrate to use patterned SOG/anti-reflective material to create patterned low-k material. In step 610, an interlayer insulation film comprising a low-k dielectric material is formed on a semiconductor substrate; this formation can be aided through deposition or other appropriate means. It should be appreciated that any type of low-k material, such as but not limited to hydrogen silsesquioxane (HSQ), methyl silsesquioxane (MSQ), hydrio polysilsesquioxane (H—PSSQ), methyl polysilsesquioxane (M-PSSQ), phenyl polysilsesquioxane (P—PSSQ), FLARE™, SILK™, Xerogel™, Nanoglass™, PAE-2, HOSP, and porous sol-gel, can be suitable for implementing the present invention While the invention contemplates use of any suitable means for forming the interlayer insulation film comprising a low-k dielectric material, in certain embodiments, the interlayer insulation film is formed on the substrate by chemical vapor deposition (CVD), plasma enhanced chemical vapor deposition (PECVD), and/or spin-on techniques.

In step 620, a SOG/anti-reflective material is formed on the interlayer insulation film. It should be appreciated that any means for forming the SOG/anti-reflective material on the interlayer insulation film should be suitable for implementing the present invention.

In step 630, a layer of photoresist is formed on the SOG/anti-reflective material; this formation can be aided by deposition or other appropriate means. It should be appreciated that any suitable means for forming the photoresist on the SOG/anti-reflective material can be used for implementing the present invention, such as but not limited to spinning the substrate to distribute liquid photoresist uniformly on its surface. In one embodiment of the invention, the photoresist comprises a polymeric material.

In step 640, the photoresist is patterned. It should be appreciated that any suitable means for patterning the photoresist can be used for implementing the present invention, such as known techniques of exposing photoresist to high energy flow through a mask having an image and then developing the photoresist using a developing solution.

In step 650, the SOG/anti-reflective material and the interlayer insulation film are patterned. While the invention contemplates use of any suitable process for patterning the SOG/anti-reflective material and the interlayer insulation film, in certain embodiments, the SOG/anti-reflective material and the interlayer insulation film are etched using the photoresist as a mask by employing a dry etching process, such as plasma etching, or a wet chemical etching process. In step 660, the photoresist is removed. In one embodiment, the photoresist is removed using an ash plasma etching process, in alternative embodiments ashing and wet etching are used.

In step 670, a curing solution is provided to contact the patterned SOG/anti-reflective material. In one embodiment, the curing process can comprise one or more steps performed under supercritical conditions. Alternatively, supercritical processing is not required for curing. The curing solution comprises at least one of low molecular weight organic acid such as, but not limited to, formic acid or acetic acid, methylsulfonic acid, gaseous ammonia, and combinations thereof. Preferably, the curing solution facilitates the removal of the SOG/anti-reflective material without substantially altering a dielectric characteristic of the patterned interlayer insulation film comprising a low-k dielectric material.

In step 680, the low-k dielectric material is cleaned. In one embodiment, the step of cleaning the low-k dielectric material comprises performing a process to remove the SOG/anti-reflective material (and photoresist, photoresist residue, and/or other residues and contaminants such as residual etching reactants and byproducts, if any) using at least one of gaseous, liquid, supercritical and near-supercritical carbon dioxide. It should be appreciated that solvents, co-solvents, chemistries, and/or surfactants can be contained in the carbon dioxide. In addition, the cleaning process can comprise one or more steps performed under supercritical conditions. Alternatively, supercritical processing is not required for cleaning. In other embodiments of the invention, a rinsing process is performed after the cleaning step.

In step 690, a query is performed to determine when the low-k patterning process has been completed. When the low-k patterning process has been completed, procedure 600 branches to step 695, and procedure 600 ends. When the low-k patterning process has not been completed, procedure 600 branches to step 670 or 680, and procedure 600 continues as shown in FIG. 6.

Figure 7:
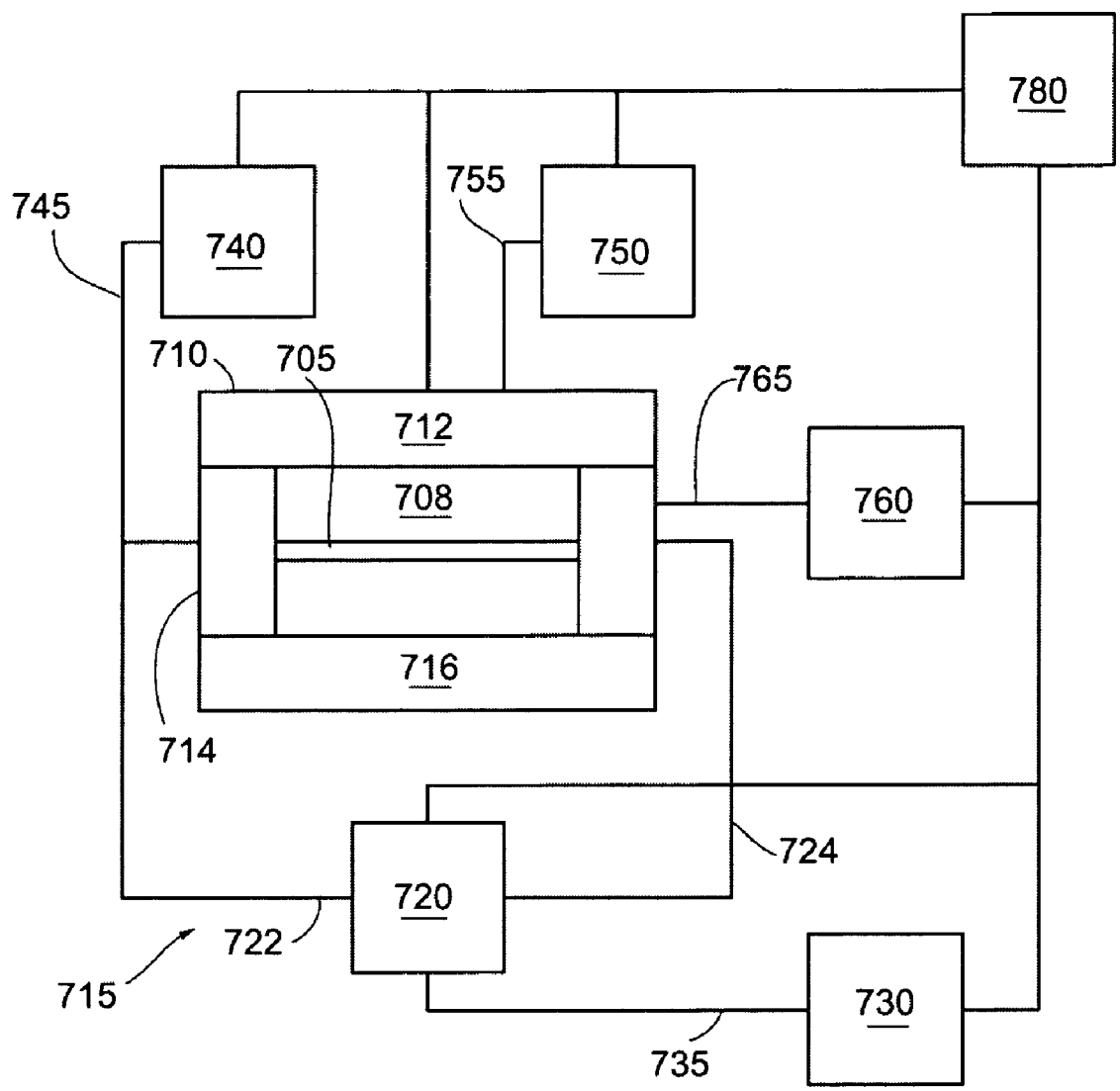
FIG. 7 shows an exemplary block diagram of a processing system in accordance with an embodiment of the invention.

FIG. 7 shows an exemplary block diagram of a processing system in accordance with an embodiment of the invention. In the illustrated embodiment, processing system 700 comprises a process module 710, a recirculation system 720, a process chemistry supply system 730, a carbon dioxide supply system 740, a pressure control system 750, an exhaust system 760, and a controller 780. The processing system 700 can operate at pressures that can range from 1000 psi to 10,000 psi. In addition, the processing system 700 can operate at temperatures that can range from 40 to 300 degrees Celsius.

The details concerning one example of a processing chamber are disclosed in co-owned and co-pending U.S. patent applications: Ser. No. 09/912,844, entitled "HIGH PRESSURE PROCESSING CHAMBER FOR SEMICONDUCTOR SUBSTRATE," filed Jul. 24, 2001; Ser. No. 09/970,309, entitled "HIGH PRESSURE PROCESSING CHAMBER FOR MULTIPLE SEMICONDUCTOR SUBSTRATES,"

filed Oct. 3, 2001; Ser. No. 10/121,791, entitled "HIGH PRESSURE PROCESSING CHAMBER FOR SEMICONDUCTOR SUBSTRATE INCLUDING FLOW ENHANCING FEATURES," filed Apr. 10, 2002; and Ser. No. 10/364,284, entitled "HIGH-PRESSURE PROCESSING CHAMBER FOR A SEMICONDUCTOR WAFER," filed Feb. 10, 2003. The contents of the aforementioned applications are incorporated herein by reference.

The controller 780 can be coupled to the process module 710, the recirculation system 720, the process chemistry supply system 730, the carbon dioxide supply system 740, the pressure control system 750, and the exhaust system 760. Alternatively, controller 780 can be coupled to one or more additional controllers/computers (not shown), and controller 780 can obtain setup and/or configuration information from an additional controller/computer.

In FIG. 7, singular processing elements (710, 720, 730, 740, 750, 760, and 780) are shown, but this is not required for the invention. The semiconductor processing system 700 can comprise any number of processing elements having any number of controllers associated with them in addition to independent processing elements.

The controller 780 can be used to configure any number of processing elements (710, 720, 730, 740, 750, and 760), and the controller 780 can collect, provide, process, store, and display data from processing elements. The controller 780 can comprise a number of applications for controlling one or more of the processing elements. For example, controller 780 can include a GUI component (not shown) that can provide easy to use interfaces that enable a user to monitor and/or control one or more processing elements.

The process module 710 can include an upper assembly 712, a frame 714, and a lower assembly 716. The upper assembly 712 can comprise a heater (not shown) for heating the process chamber, the substrate, or the processing fluid, or a combination of two or more thereof. Alternatively, a heater is not required. The frame 714 can include means for flowing a processing fluid through the processing chamber 708. In one example, a circular flow pattern can be established, and in another example, a substantially linear flow pattern can be established. Alternatively, the means for flowing can be configured differently. The lower assembly 716 can comprise one or more lifters (not shown) for moving the chuck 718 and/or the substrate 705. Alternatively, a lifter is not required.

In one embodiment, the process module 710 can include a holder or chuck 718 for supporting and holding the substrate 705 while processing the substrate 705. The holder or chuck 718 can also be configured to heat or cool the substrate 705 before, during, and/or after processing the substrate 705. Alternatively, the process module 710 can include a platen for supporting and holding the substrate 705 while processing the substrate 705.

A transfer system (not shown) can be used to move a substrate into and out of the processing chamber 708 through a slot (not shown). In one example, the slot can be opened and closed by moving the chuck, and in another example, the slot can be controlled using a gate valve.

The substrate can include semiconductor material, metallic material, dielectric material, ceramic material, or polymer material, or a combination of two or more thereof. The semiconductor material can include Si, Ge, Si/Ge, or GaAs. The metallic material can include Cu, Al, Ni, Pb, Ti, Ta, or W, or combinations of two or more thereof. The dielectric material can include Si, O, N, or C, or combinations of two or more thereof. The ceramic material can include Al, N, Si, C, or O, or combinations of two or more thereof.

The recirculation system can be coupled to the process module 710 using one or more inlet lines 722 and one or more outlet lines 724. The recirculation system 720 can comprise one or more valves for regulating the flow of a supercritical processing solution through the recirculation system and through the process module 710. The recirculation system 720 can comprise any number of back-flow valves, filters, pumps, and/or heaters (not shown) for maintaining a supercritical processing solution and flowing the supercritical process solution through the recirculation system 720 and through the processing chamber 708 in the process module 710.

Processing system 700 can comprise a chemistry supply system 730. In the illustrated embodiment, the chemistry supply system is coupled to the recirculation system 720 using one or more lines 735, but this is not required for the invention. In alternative embodiments, the chemical supply system can be configured differently and can be coupled to different elements in the processing system. For example, the chemistry supply system 730 can be coupled to the process module 710.

The chemistry supply system 730 can comprise a curing chemistry assembly (not shown) for providing curing chemistry for generating supercritical curing solutions within the processing chamber. The curing chemistry can include at least one of low molecular weight organic acid such as, but not limited to, formic acid or acetic acid, methylsulfonic acid, gaseous ammonia, and combinations thereof.

The chemistry supply system 730 can comprise a cleaning chemistry assembly (not shown) for providing cleaning chemistry for generating supercritical cleaning solutions within the processing chamber. The cleaning chemistry can include solvents, co-solvents, surfactants, and/or other ingredients. Examples of solvents, co-solvents, and surfactants are disclosed in co-owned U.S. Pat. No. 6,500,605, entitled "REMOVAL OF PHOTORESIST AND RESIDUE FROM SUBSTRATE USING SUPERCRITICAL CARBON DIOXIDE PROCESS", issued Dec. 31, 2002, and U.S. Pat. No. 6,277,753, entitled "REMOVAL OF CMP RESIDUE FROM SEMICONDUCTORS USING SUPERCRITICAL CARBON DIOXIDE PROCESS", issued Aug. 21, 2001, which are incorporated by reference.

The chemistry supply system 730 can comprise a rinsing chemistry assembly (not shown) for providing rinsing chemistry for generating supercritical rinsing solutions within the processing chamber. The rinsing chemistry can include one or more organic solvents including, but not limited to, alcohols and ketones.

The chemistry supply system 730 can comprise a curing chemistry assembly (not shown) for providing curing chemistry for generating supercritical curing solutions within the processing chamber.

The processing system 700 can comprise a carbon dioxide supply system 740. As shown in FIG. 7, the carbon dioxide supply system 740 can be coupled to the process module 710 using one or more lines 745, but this is not required. In alternative embodiments, carbon dioxide supply system 740 can be configured differently and coupled differently. For example, the carbon dioxide supply system 740 can be coupled to the recirculation system 720.

The carbon dioxide supply system 740 can comprise a carbon dioxide source (not shown) and a plurality of flow control elements (not shown) for generating a supercritical fluid. For example, the carbon dioxide source can include a $CO_2$ feed system, and the flow control elements can include supply lines, valves, filters, pumps, and heaters. The carbon dioxide supply system 740 can comprise an inlet valve (not shown) that is configured to open and close to allow or prevent the stream of supercritical carbon dioxide from flowing into the processing chamber 708. For example, controller 780 can be used to determine fluid parameters such as pressure, temperature, process time, and flow rate.

The carbon dioxide supply system 740 can comprise a decontamination system 742 for removing contaminants from the carbon dioxide supplied by the carbon dioxide supply system 740. Temperature and/or pressures changes along with filtering can be used to remove contaminants and produce a purified fluid.

The processing system 700 can also comprise a pressure control system 750. As shown in FIG. 7, the pressure control system 750 can be coupled to the process module 710 using one or more lines 755, but this is not required. In alternative embodiments, pressure control system 750 can be configured differently and coupled differently. The pressure control system 750 can include one or more pressure valves (not shown) for exhausting the processing chamber 708 and/or for regulating the pressure within the processing chamber 708. Alternatively, the pressure control system 750 can also include one or more pumps (not shown). For example, one pump may be used to increase the pressure within the processing chamber, and another pump may be used to evacuate the processing chamber 708. In another embodiment, the pressure control system 750 can comprise means for sealing the processing chamber. In addition, the pressure control system 750 can comprise means for raising and lowering the substrate and/or the chuck.

Furthermore, the processing system 700 can comprise an exhaust control system 760. As shown in FIG. 7, the exhaust control system 760 can be coupled to the process module 710 using one or more lines 765, but this is not required. In alternative embodiments, exhaust control system 760 can be configured differently and coupled differently. The exhaust control system 760 can include an exhaust gas collection vessel (not shown) and can be used to remove contaminants from the processing fluid. Alternatively, the exhaust control system 760 can be used to recycle the processing fluid.

Controller 780 can use pre-process data, process data, and post-process data. For example, pre-process data can be associated with an incoming substrate. This pre-process data can include lot data, batch data, run data, composition data, and history data. The pre-process data can be used to establish an input state for a wafer. Process data can include process parameters. Post processing data can be associated with a processed substrate.

The controller 780 can use the pre-process data to predict, select, or calculate a set of process parameters to use to process the substrate. For example, this predicted set of process parameters can be a first estimate of a process recipe. A process model can provide the relationship between one or more process recipe parameters or set points and one or more process results. A process recipe can include a multi-step process involving a set of process modules. Post-process data can be obtained at some point after the substrate has been processed. For example, post-process data can be obtained after a time delay that can vary from minutes to days. The controller can compute a predicted state for the substrate based on the pre-process data, the process characteristics, and a process model. For example, a cleaning rate model can be used along with a contaminant level to compute a predicted cleaning time. Alternatively, a rinse rate model can be used along with a contaminant level to compute a processing time for a rinse process.

The controller 780 can be used to monitor and/or control the level of the contaminants in the incoming fluids and/or gasses, in the processing fluids and/or gasses, and in the exhaust fluids and/or gasses. For example, controller 780 can determine when contamination system 740 operates.

It will be appreciated that the controller 780 can perform other functions in addition to those discussed here. The controller 780 can monitor the pressure, temperature, flow, or other variables associated with the processing system 700 and take actions based on these values. The controller 780 can process measured data, display data and/or results on a GUI screen, determine a fault condition, determine a response to a fault condition, and alert an operator. For example, controller 780 can process contaminant level data, display the data and/or results on a GUI screen, determine a fault condition, such as a high level of contaminants, determine a response to the fault condition, and alert an operator (send an email and/or a page) that the contaminant level is approaching a limit or is above a limit. The controller 780 can comprise a database component (not shown) for storing input data, process data, and output data.

In a supercritical cleaning/rinsing process, the desired process result can be a process result that is measurable using an optical measuring device. For example, the desired process result can be an amount of contaminant in a via or on the surface of a substrate. After each cleaning process run, the desired process result can be measured.

Figure 8:
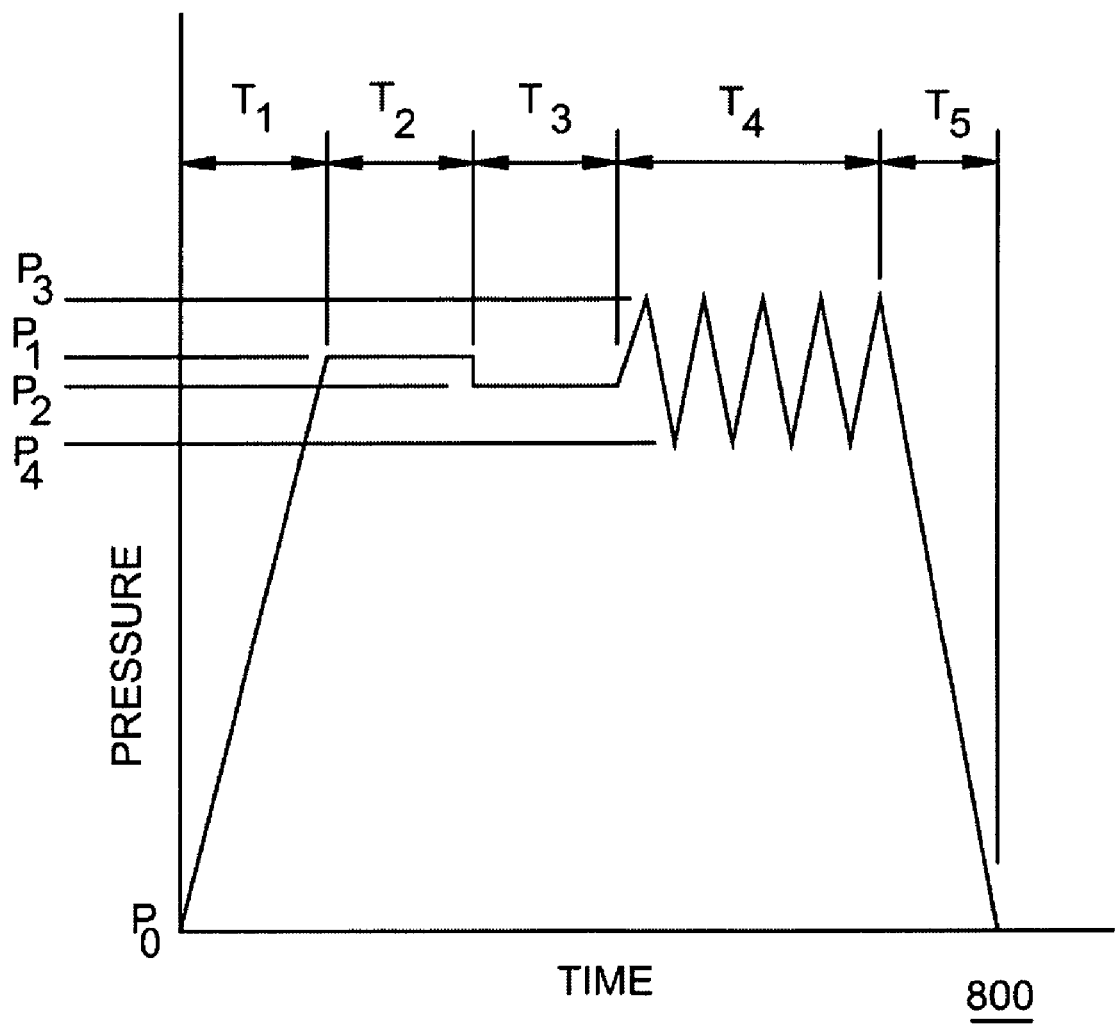
FIG. 8 illustrates an exemplary graph of pressure versus time for a curing, cleaning, and/or rinsing process in accordance with an embodiment of the invention.

FIG. 8 illustrates an exemplary graph of pressure versus time for a curing, cleaning, and/or rinsing process in accordance with an embodiment of the invention. In the illustrated embodiment, a graph 800 of pressure versus time is shown, and the graph 800 can be used to represent a supercritical curing process step, a supercritical rinsing process step, or a supercritical cleaning process step, or a combination thereof. Alternatively, different pressures, different timing, and different sequences may be used for different processes.

Now referring to both FIGS. 7 and 8, prior to an initial time $T_0$, the substrate to be processed can be placed within the processing chamber 708 and the processing chamber 708 can be sealed. For example, during the curing, cleaning, and/or rinsing process, a substrate can have patterned SOG/anti-reflective material and/or residue/contaminants thereon. The substrate, the processing chamber, and the other elements in the recirculation loop 715 (FIG. 7) can be heated to an operational temperature, and the operational temperature can range from 40 to 300 degrees Celsius. For example, the processing chamber 108, the recirculation system, and piping coupling the recirculation system to the processing chamber can form a recirculation loop.

From the initial time $T_0$ through a first duration of time $T_1$, the elements in the recirculation loop 715 (FIG. 7) can be pressurized. During a first portion of the time $T_1$, the carbon dioxide supply system 740 can be coupled into the flow path and can be used to provide temperature controlled fluid into the processing chamber 708 and/or other elements in the recirculation loop 715 (FIG. 7).

In one embodiment, the carbon dioxide supply system 740 can be operated during a pressurization process and can be used to fill the recirculation loop with temperature-controlled carbon dioxide. The carbon dioxide supply system 740 can comprise means for filling the recirculation loop with the temperature-controlled carbon dioxide, and the temperature variation of the carbon dioxide can be controlled to be less than approximately 10 degrees Celsius during the pressurization process. Alternatively, the temperature variation of the carbon dioxide can be controlled to be less than approximately 5 degrees Celsius during the pressurization process.

For example, a supercritical fluid, such as supercritical $CO_2$, can be used to pressurize the processing chamber 708 and the other elements in the recirculation loop 715 (FIG. 7). During time $T_1$, a pump (not shown) in the recirculation system 720 (FIG. 7) can be started and can be used to circulate the temperature controlled fluid through the processing chamber 708 and the other elements in the recirculation loop 715 (FIG. 7).

In one embodiment, when the pressure in the processing chamber 708 exceeds a critical pressure Pc (1,070 psi), process chemistry can be injected into the processing chamber 708, using the process chemistry supply system 730. In one embodiment, the carbon dioxide supply system 740 can be switched off before the process chemistry is injected. Alternatively, the carbon dioxide supply system 740 can be switched on while the process chemistry is injected.

In other embodiments, process chemistry may be injected into the processing chamber 708 before the pressure exceeds the critical pressure Pc (1,070 psi) using the process chemistry supply system 730. For example, the injection(s) of the process chemistries can begin upon reaching about 1100-1200 psi. In other embodiments, process chemistry is not injected during the $T_1$ period.

In one embodiment, process chemistry is injected in a linear fashion, and the injection time can be based on a recirculation time. For example, the recirculation time can be determined based on the length of the recirculation path and the flow rate. In other embodiments, process chemistry may be injected in a non-linear fashion. For example, process chemistry can be injected in one or more steps.

The process chemistry can include a curing agent, a cleaning agent, or a rinsing agent, or a combination thereof that is injected into the supercritical fluid. One or more injections of process chemistries can be performed over the duration of time $T_1$ to generate a supercritical processing solution with the desired concentrations of chemicals. The process chemistry, in accordance with the embodiments of the invention, can also include one more or more carrier solvents.

Still referring to both FIGS. 7 and 8, during a second time $T_2$, the supercritical processing solution can be re-circulated over the substrate and through the processing chamber 708 using the recirculation system 720, such as described above. In one embodiment, the process chemistry supply system 730 can be switched off, and process chemistry is not injected during the second time $T_2$. Alternatively, the process chemistry supply system 730 can be switched on, and process chemistry may be injected into the processing chamber 708 during the second time $T_2$ and/or after the second time $T_2$.

The processing chamber 708 can operate at a pressure above 1,500 psi during the second time $T_2$. For example, the pressure can range from approximately 2,500 psi to approximately 3,100 psi, but can be any value so long as the operating pressure is sufficient to maintain supercritical conditions. The supercritical processing solution is circulated over the substrate and through the processing chamber 708 using the recirculation system 720, such as described above. The supercritical conditions within the processing chamber 108 and the other elements in the recirculation loop 715 (FIG. 7) are maintained during the second time $T_2$, and the supercritical processing solution continues to be circulated over the substrate and through the processing chamber 108 and the other elements in the recirculation loop 715 (FIG. 7). The recirculation system 720 (FIG. 7), can be used to regulate the flow of the supercritical processing solution through the processing chamber 708 and the other elements in the recirculation loop 715 (FIG. 7).

Still referring to FIGS. 7 and 8, during a third time $T_3$, one or more push-through processes can be performed. The carbon dioxide supply system 740 can comprise means for providing a first volume of temperature-controlled purified fluid during a push-through process, and the first volume can be larger than the volume of the recirculation loop. Alternatively, the first volume can be less than or approximately equal to the volume of the recirculation loop. In addition, the temperature differential within the first volume of temperature-controlled fluid during the push-through process can be controlled to be less than approximately 10 degrees Celsius. Alternatively, the temperature variation of the temperature-controlled fluid can be controlled to be less than approximately 5 degrees Celsius during a push-through process.

In other embodiments, the carbon dioxide supply system 740 can comprise means for providing one or more volumes of temperature controlled fluid during a push-through process; each volume can be larger than the volume of the processing chamber or the volume of the recirculation loop; and the temperature variation associated with each volume can be controlled.

For example, during the third time $T_3$, one or more volumes of temperature controlled supercritical carbon dioxide can be fed into the processing chamber 708 and the other elements in the recirculation loop 715 from the carbon dioxide supply system 740, and the supercritical curing, cleaning, and/or rinsing solution along with process residue suspended or dissolved therein can be displaced from the processing chamber 708 and the other elements in the recirculation loop 715 through the exhaust control system 760. In an alternative embodiment, temperature controlled supercritical carbon dioxide and solvents can be fed into the recirculation system 720, and the supercritical curing, cleaning, and/or rinsing solution along with process residue suspended or dissolved therein can also be displaced from the processing chamber 708 and the other elements in the recirculation loop 715 through the exhaust control system 760.

Providing temperature-controlled fluid during the push-through process prevents process residue suspended or dissolved within the fluid being displaced from the processing chamber 708 and the other elements in the recirculation loop 715 from dropping out and/or adhering to the processing chamber 708 and the other elements in the recirculation loop 715. In addition, during the third time $T_3$, the temperature of the fluid supplied by the carbon dioxide supply system 740 can vary over a wider temperature range than the range used during the second time $T_2$.

In the illustrated embodiment shown in FIG. 8, a single second time $T_2$ is followed by a single third time $T_3$, but this is not required. In alternative embodiments, other time sequences may be used to process a substrate.

After the push-through process is complete, a pressure cycling process can be performed. Alternatively, one or more pressure cycles can occur during the push-through process. In other embodiments, a pressure cycling process is not required. During a fourth time $T_4$, the processing chamber 708 can be cycled through a plurality of decompression and compression cycles. The pressure can be cycled between a first pressure $P_3$ and a second pressure $P_4$ one or more times. In alternative embodiments, the first pressure $P_3$ and a second pressure $P_4$ can vary. In one embodiment, the pressure can be lowered by venting through the exhaust control system 760. For example, this can be accomplished by lowering the pressure to below approximately 1,500 psi and raising the pressure to above approximately 2,500 psi. The pressure can be increased by using the carbon dioxide supply system 740 to provide additional high-pressure fluid.

The carbon dioxide supply system 740 can comprise means for providing a first volume of temperature-controlled fluid during a compression cycle, and the first volume can be larger than the volume of the recirculation loop. Alternatively, the first volume can be less than or approximately equal to the volume of the recirculation loop. In addition, the temperature differential within the first volume of temperature-controlled fluid during the compression cycle can be controlled.

In addition, the carbon dioxide supply system 740 can comprise means for providing a second volume of temperature-controlled fluid during a decompression cycle, and the second volume can be larger than the volume of the recirculation loop. Alternatively, the second volume can be less than or approximately equal to the volume of the recirculation loop. In addition, the temperature differential within the second volume of temperature-controlled fluid can be controlled during a decompression cycle.

In other embodiments, the carbon dioxide supply system 740 can comprise means for providing one or more volumes of temperature controlled fluid during a compression cycle and/o decompression cycle; each volume can be larger than the volume of the processing chamber or the volume of the recirculation loop; the temperature variation associated with each volume can be controlled, and the temperature variation can be allowed to increase as additional cycles are performed.

Furthermore, during the fourth time $T_4$, one or more volumes of temperature controlled supercritical carbon dioxide can be fed into the processing chamber 708 and the other elements in the recirculation loop 715 from the carbon dioxide supply system 740, and the supercritical curing, cleaning, and/or rinsing solution along with process residue suspended or dissolved therein can be displaced from the processing chamber 708 and the other elements in the recirculation loop 715 through the exhaust control system 760. In an alternative embodiment, the supercritical carbon dioxide can be fed into the recirculation system 720, and the supercritical curing, cleaning, and/or rinsing solution along with process residue suspended or dissolved therein can also be displaced from the processing chamber 708 and the other elements in the recirculation loop 715 through the exhaust control system 760.

Providing temperature-controlled fluid during the pressure cycling process prevents process residue suspended or dissolved within the fluid being displaced from the processing chamber 708 and the other elements in the recirculation loop 715 from dropping out and/or adhering to the processing chamber 708 and the other elements in the recirculation loop 715. In addition, during the fourth time $T_4$, the temperature of the fluid supplied by the carbon dioxide supply system 740 can vary over a wider temperature range than the range used during the second time $T_2$.

In the illustrated embodiment shown in FIG. 8, a single third time $T_3$ is followed by a single fourth time $T_4$, but this is not required. In alternative embodiments, other time sequences may be used to process a substrate.

In an alternative embodiment, the carbon dioxide supply system 740 can be switched off during a portion of the fourth time $T_4$. For example, the carbon dioxide supply system 740 can be switched off during a decompression cycle.

During a fifth time $T_5$, the processing chamber 708 can be returned to lower pressure. For example, after the pressure cycling process is completed, then the processing chamber can be vented or exhausted to atmospheric pressure.

The carbon dioxide supply system 740 can comprise means for providing a volume of temperature-controlled fluid during a venting process, and the volume can be larger than the volume of the recirculation loop. Alternatively, the volume can be less than or approximately equal to the volume of the recirculation loop. In addition, the temperature differential within the volume of temperature-controlled purified fluid can be controlled during a venting process.

In other embodiments, the carbon dioxide supply system 740 can comprise means for providing one or more volumes of temperature controlled fluid during a venting process; each volume can be larger than the volume of the processing chamber or the volume of the recirculation loop; the temperature variation associated with each volume can be controlled, and the temperature variation can be allowed to increase as the pressure approaches the final pressure.

Furthermore, during the fifth time $T_5$, one or more volumes of temperature controlled supercritical carbon dioxide can be fed into the processing chamber 708 and the other elements in the recirculation loop 715 from the carbon dioxide supply system 740, and the remaining supercritical curing, cleaning, and/or rinsing solution along with process residue suspended or dissolved therein can be displaced from the processing chamber 708 and the other elements in the recirculation loop 715 through the exhaust control system 760. In an alternative embodiment, the supercritical carbon dioxide can be fed into the recirculation system 720, and the remaining supercritical curing, cleaning, and/or rinsing solution along with process residue suspended or dissolved therein can also be displaced from the processing chamber 708 and the other elements in the recirculation loop 715 through the exhaust control system 760.

Providing temperature-controlled fluid during the venting process prevents process residue suspended or dissolved within the fluid being displaced from the processing chamber 708 and the other elements in the recirculation loop 715 from dropping out and/or adhering to the processing chamber 708 and the other elements in the recirculation loop 715.

In the illustrated embodiment shown in FIG. 8, a single fourth time $T_4$ is followed by a single fifth time $T_5$, but this is not required. In alternative embodiments, other time sequences may be used to process a substrate.

In one embodiment, during a portion of the fifth time $T_5$, the carbon dioxide supply system 740 can be switched off. In addition, the temperature of the fluid supplied by the carbon dioxide supply system 740 can vary over a wider temperature range than the range used during the second time $T_2$. For example, the temperature can range below the temperature required for supercritical operation.

For substrate processing, the chamber pressure can be made substantially equal to the pressure inside of a transfer chamber (not shown) coupled to the processing chamber. In one embodiment, the substrate can be moved from the processing chamber into the transfer chamber, and moved to a second process apparatus or module to continue processing.

In the illustrated embodiment shown in FIG. 8, the pressure returns to an initial pressure $P_0$, but this is not required for the invention. In alternative embodiments, the pressure does not have to return to $P_0$, and the process sequence can continue with additional time steps such as those shown in time steps $T_1, T_2, T_3, T_4,$ or $T_5$.

The graph 800 is provided for exemplary purposes only. It will be understood by those skilled in the art that a supercritical process can have any number of different time/pressures or temperature profiles without departing from the scope of the invention. Further, any number of cleaning, rinsing, and/or curing process sequences with each step having any number of compression and decompression cycles are contemplated. In addition, as stated previously, concentrations of various chemicals and species within a supercritical processing solution can be readily tailored for the application at hand and altered at any time within a supercritical processing step.

While the invention has been described in terms of specific embodiments incorporating details to facilitate the understanding of the principles of construction and operation of the invention, such reference herein to specific embodiments and details thereof is not intended to limit the scope of the claims appended hereto. It will be apparent to those skilled in the art that modifications may be made in the embodiments chosen for illustration without departing from the spirit and scope of the invention.

What is claimed is:

1. A method of treating a substrate comprising a SOG/anti-reflective material layer formed on a low-k dielectric material layer formed on a semiconductor material layer, the method comprising the steps of:
    patterning the SOG/anti-reflective material layer;
    patterning the low-k dielectric layer; and
    treating the SOG/anti-reflective material with a curing solution, wherein the curing solution comprises a low molecular weight organic acid, methylsulfonic acid, or gaseous ammonia, or a combination thereof.

2. The method of claim 1, wherein the low-k dielectric material is selected from the group consisting of hydrogen silsesquioxane (HSQ), methyl silsesquioxane (MSQ), hydrio polysilsesquioxane (H-PSSQ), methyl polysilsesquioxane (M-PSSQ), phenyl polysilsesquioxane (P-PSSQ), PAE-2, HOSP, and porous sol-gel.

3. The method of claim 1, further comprising the step of removing the curing solution and the SOG/anti-reflective material, after the treating step.

4. The method of claim 1, wherein the low-k dielectric material layer comprises a low-k inter-metal-dielectric (IMD) layer.

5. The method of claim 3, wherein the SOG/anti-reflective material layer formed on the low-k IMD layer comprises a dual damascene interconnection layer formed employing a SOG/anti-reflective material formed on the low-k IMD layer.

6. A method of cleaning a microelectronic device, comprising the steps of:
    providing a substrate having a patterned SOG/anti-reflective material layer;
    performing a process to cure the patterned SOG/anti-reflective material; and
    performing a cleaning process to remove the cured patterned SOG/anti-reflective material, wherein the substrate further comprises a layer of low-k dielectric material and wherein the low-k dielectric material is selected from the group consisting of hydrogen silsesquioxane (HSQ), methyl silsesquioxane (MSQ), hydrio polysilsesquioxane (H-PSSQ), methyl polysilsesquioxane (M-PSSQ), phenyl polysilsesquioxane (P-PSSQ), PAE-2, HOSP, and porous sol-gel.

7. The method of claim 6, wherein the low-k dielectric layer comprises a low-k inter-metal-dielectric (IMD) layer, or an ultra low-k IMD layer.

8. The method of claim 6, wherein the step of performing a process to cure the SOG/anti-reflective material comprises contacting the SOG/anti-reflective material with a curing solution.

9. The method of claim 8, wherein the curing solution comprises formic acid, acetic acid, methylsulfonic acid, or gaseous ammonia, or a combination thereof.

10. The method of claim 6, wherein the cleaning process comprises the steps of:
    introducing a cleaning chemistry into a processing chamber;
    pressurizing the processing chamber; and
    recirculating the cleaning chemistry within the processing chamber.

11. The method of claim 10, wherein the cleaning chemistry comprises gaseous, liquid, supercritical, or near-supercritical carbon dioxide, or combinations thereof.

12. The method of claim 11, wherein the cleaning chemistry comprises a solvent, a co-solvent, or a surfactant, or a combination thereof.

13. A method of cleaning a microelectronic device, comprising the steps of:
    positioning a substrate having a patterned SOG/anti-reflective material layer in a process chamber;
    providing a curing solution to the process chamber;
    curing the patterned SOG/anti-reflective material with the curing solution;
    removing the curing solution from the process chamber;
    providing a cleaning fluid to the process chamber; and
    removing the cured SOG/anti-reflective material with the cleaning fluid, wherein the curing solution comprises methylsulfonic acid, acetic acid, formic acid, or gaseous ammonia, or a combination thereof.

14. The method of claim 13, wherein the substrate further comprises a low-k dielectric layer.

15. The method of claim 14, wherein the low-k dielectric layer is selected from the group consisting of hydrogen silsesquioxane (HSQ), methyl silsesquioxane (MSQ), hydrio polysilsesquioxane (H-PSSQ), methyl polysilsesquioxane (M-PSSQ), phenyl polysilsesquioxane (P-PSSQ), PAE-2, HOSP, and porous sol-gel.

16. A method of fabricating an microelectronic device, comprising the steps of:
    forming an interlayer insulation film comprising a low-k dielectric material on a semiconductor substrate;
    forming a SOG/anti-reflective material on the interlayer insulation film;
    forming a photoresist on the SOG/anti-reflective material;
    patterning the photoresist;
    patterning the SOG/anti-reflective material and the interlayer insulation film using the photoresist as a mask;
    removing the photoresist;
    curing the patterned SOG/anti-reflective material using a curing solution; and
    cleaning the low-k dielectric material by removing the cured patterned SOG/anti-reflective material.

17. The method of claim 16, wherein the low-k dielectric material is selected from the group consisting of hydrogen silsesquioxane (HSQ), methyl silsesquioxane (MSQ), hydrio polysilsesquioxane (H-PSSQ), methyl polysilsesquioxane (M-PSSQ), phenyl polysilsesquioxane (P-PSSQ), PAE-2, HOSP, and porous sol-gel.

18. The method of claim 16, wherein the curing solution comprises a low molecular weight organic acid, methylsulfonic acid, or gaseous ammonia, or a combination thereof.

19. The method of claim 16, wherein the curing solution comprises gaseous, liquid, supercritical, or near-supercritical carbon dioxide, or a combination thereof.

20. An apparatus for cleaning a microelectronic device comprising:
    a) a processing chamber including a substrate holder;
    b) means for pressurizing the processing chamber;
    c) means for performing a SOG/anti-reflective material curing process within the processing chamber, the means for performing a SOG/anti-reflective material curing process within the processing chamber comprising:
        i) means for introducing a curing chemistry into the processing chamber; and
        ii) means for recirculating the curing chemistry;
    d) means for performing a cleaning process within the processing chamber, wherein means for performing a SOG/anti-reflective material curing process comprises means for contacting the SOG/anti-reflective material with a curing solution; and
    e) means for venting the processing chamber.

21. The apparatus of claim 20, wherein means for pressurizing the processing chamber comprises means for pressurizing the processing chamber with gaseous, liquid, supercritical, or near-supercritical carbon dioxide, or a combination thereof.

* * * * *